(12) United States Patent
Matsuoka et al.

(10) Patent No.: US 7,871,211 B2
(45) Date of Patent: Jan. 18, 2011

(54) COATING AND DEVELOPING SYSTEM, COATING AND DEVELOPING METHOD AND STORAGE MEDIUM

(75) Inventors: Nobuaki Matsuoka, Koshi (JP); Takahiro Hashimoto, Koshi (JP); Katsuhiro Tsuchiya, Tokyo-To (JP); Shinichi Hayashi, Koshi (JP); Yasushi Hayashida, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 473 days.

(21) Appl. No.: 12/058,252

(22) Filed: Mar. 28, 2008

(65) Prior Publication Data

US 2008/0241403 A1 Oct. 2, 2008

(30) Foreign Application Priority Data

Mar. 30, 2007 (JP) ............................. 2007-095742

(51) Int. Cl.
*G03D 5/00* (2006.01)
*G03B 27/52* (2006.01)
*B05C 11/02* (2006.01)
*G03F 1/00* (2006.01)

(52) U.S. Cl. ........................... 396/611; 355/27; 118/52; 430/327

(58) Field of Classification Search ................. 396/611; 430/327, 331; 118/52, 54, 56, 66, 69, 319, 118/320, 500, 697; 427/240, 331; 355/27
See application file for complete search history.

(56) References Cited

U.S. PATENT DOCUMENTS

| | | | |
|---|---|---|---|
| 6,377,329 B1 * | 4/2002 | Takekuma | .................... 355/27 |
| 6,681,916 B2 * | 1/2004 | Hiroki | ..................... 198/347.1 |
| 7,267,497 B2 | 9/2007 | Akimoto et al. | |
| 2006/0165408 A1 | 7/2006 | Akimoto et al. | |
| 2006/0201615 A1 * | 9/2006 | Matsuoka et al. | ........ 156/272.2 |
| 2007/0056514 A1 * | 3/2007 | Akimoto et al. | ............. 118/716 |
| 2007/0186850 A1 * | 8/2007 | Matsuoka et al. | ........... 118/719 |

FOREIGN PATENT DOCUMENTS

| | | |
|---|---|---|
| JP | 2000-331922 | 11/2000 |
| JP | 2005-203635 | 7/2005 |
| JP | 2006-203075 | 8/2006 |
| JP | 2006-216614 | 8/2006 |
| JP | 2006-287178 | 10/2006 |
| WO | WO00/68118 | 11/2000 |

* cited by examiner

*Primary Examiner*—Alan A Mathews
(74) *Attorney, Agent, or Firm*—Oblon, Spivak, McClelland, Maier & Neustadt, L.L.P.

(57) ABSTRACT

A coating and developing system has a first processing block, a second processing block, and a transfer block interposed between the first and the second processing block. A first direct carrying means carries substrates from a carrier block to the transfer block. The transfer block distributes the substrates to respective film forming unit blocks of the first and the second processing block. Substrates on which films have been formed by the first and the second processing block are collected temporarily in the transfer block. A second direct carrying means carries the substrate collected in the transfer block from the transfer block to an interface block. Use of the first and the second processing block can improve the throughput of the coating and developing system. Since a carrying route from the carrier block to the first processing block, and a carrying route from the carrier block to the second processing block are the same, a carrying program is easy to create.

20 Claims, 17 Drawing Sheets

COATING AND DEVELOPING SYSTEM, COATING AND DEVELOPING METHOD AND STORAGE MEDIUM

BACKGROUND OF THE INVENTION

1. Field of the Invention

The present invention relates to a coating and developing system for coating a substrate, such as a semiconductor wafer or an LCD substrate, namely, a glass substrate for a liquid crystal display, with a resist solution by a coating process and processing the substrate by a developing process after exposure, a coating and developing method to be carried out by the coating and developing system, and a storage medium.

2. Description of the Related Art

A manufacturing process for manufacturing a semiconductor device or an LCD substrate forms a resist patter on a substrate by photolithography. Photolithography includes a series of steps of coating a surface of a substrate, such as a semiconductor wafer (hereinafter, referred to as "wafer") with a resist film by applying a resist solution to the surface, exposing the resist film to light through a photomask, and processing the exposed resist film by a developing process to form a desired pattern.

Generally, those processes are carried out by a resist pattern forming system constructed by connecting an exposure system to a coating and developing system for coating a surface of a substrate with a resist solution and developing an exposed film. Such a resist pattern forming system is proposed in, for example, JP-A 2006-203075. In such a coating and developing system, an area in which modules for processing a substrate before the substrate is subjected to an exposure process, and an area in which modules for processing the substrate processed by the exposure system are vertically arranged in layers to further increase the processing rate of the coating and developing system, carrying devices are installed respectively in those areas to improve carrying efficiency by reducing load on the carrying devices so that the throughput of the coating and developing system may be increased.

Referring to FIG. 17, showing this known resist pattern forming system, a carrier block S1, a processing block S2 and an interface block arranged in that order are connected. The processing block S2 is built by stacking up developing blocks B1 and B2 for carrying out a developing process, a coating block B4 for carrying out a resist solution application process, and antireflection film forming blocks B3 and B5 for carrying out an antireflection film forming process before and after the resist solution application process. The blocks B1 to B5 of the processing block S2 are provided with wet-processing units for carrying out wet processes, such as the developing process, the resist solution application process and the chemical solution application process for applying a chemical solution for forming an antireflection film, shelf units formed by stacking up processing units for carrying out processes before and after the wet processes, carrying devices A1 to A5 for carrying wafers W to and from the modules of the wet-processing units and the shelf units, and exclusive transfer arms for transferring wafers W through the shelf units U5 and U6 to and from the blocks B1 to B5.

A transfer arm C installed in the carrier block S1 carries a wafer W to the processing block S2, and the carrying devices A1 to A5 and transfer arms D1 and D2 carry the wafer W to the desired processing units. Thus loads on the transfer arm C, the carrying devices A1 to A5, and the transfer arms are reduced to improve the throughput of the resist pattern forming system.

The resist pattern forming system is provided, for example, with three set-processing units, and the processing units. The number of the processing units corresponds to that of the wet-processing units. Although this resist film forming system can process wafers at a throughput on the order of, for example, 180 wafers/hr, the market demands for a system capable of processing wafers at a high throughput in the range of 200 to 250 wafers/hr.

If the numbers of wet-processing modules of the developing block B1 and the coating block B3, and the processing units for carrying out processes before and after the wet processes are increased with an aim to improve the throughput, loads on the carrying devices increase, which makes the improvement of the throughput of the system difficult. The number of the stacked developing blocks B1 may be increased and the number of the wet-processing modules and the processing units may be increased for the same purpose. However, loads on the transfer arms for transferring wafers to and from the blocks B1 to B5 increase inevitably, which also makes the improvement of the throughput of the system difficult.

The throughput may be improved by using a plurality of processing blocks like the processing block S2. If the plurality of processing blocks S2 are installed to increase the number of the coating blocks B4 or the like, wafers are carried to the coating block B3 of the processing block S2 near the carrier block S1 and to the coating block B3 of the processing block S2 remote from the carrier block S1 along different carrying passages, respectively. Therefore the carrying passages are complicated and the creation of a carrying program requires a very complicated procedure.

SUMMARY OF THE INVENTION

The present invention has been made under such circumstances and it is therefore an object of the present invention to provide techniques for facilitating creating a carrying program for a coating and developing system and to improve the throughput of the coating and developing system.

A coating and developing system according to the present invention, for forming films including a resist film on a substrate carried in a carrier delivered to a carrier block by film forming unit blocks, carrying the substrate through an interface block to an exposure system, processing the substrate processed by an exposure process and returned through the interface block from the exposure system by a developing process by a developing unit block, transferring the substrate processed by the developing process to the carrier block, each of film forming unit blocks and developing unit blocks including a wet-processing module for applying a chemical solution to a substrate, a heating module for heating a substrate, a cooling module for cooling a substrate, substrate carrying means for carrying a substrate to and from those modules, includes: a first processing block connected to the carrier block, formed by stacking up a plurality of unit blocks including a film forming block in layers, and capable of receiving a substrate carried by a transfer means installed in the carrier block from the carrier block and of transferring a substrate to the carrier block by the transfer means; a second processing block connected to the interface block, formed by stacking up a plurality of unit blocks including a film forming unit block in layers, and capable of receiving a substrate carried by an interface arm installed in the interface block from the interface block and of transferring a substrate to the interface block by the interface arm; a transfer block interposed between the first and the second processing block, and including a plurality of common transfer units stacked up in layers to receive a substrate from and to transfer a substrate to substrate carrying means included in the unit blocks of the first and the second processing block, and provided with a transfer arm for carrying a substrate to and from the common transfer units; a developing module installed at least in either of the first and the second processing block and put on the film forming unit block; first direct carrying means installed in the first processing block to transfer a substrate between the carrier block and the common transfer unit blocks of the transfer block; second direct carrying means installed in the second processing block to transfer a substrate between the common transfer unit blocks of the transfer block and the interface block; and a control means for controlling the transfer means, the direct carrying means, the transfer arms, the substrate carrying means and the interface arm so that the first direct carrying means carries a substrate from the carrier block to the transfer block, substrates are transferred from the transfer block selectively to the film forming unit block of the first processing block and to the film forming unit block of the second processing block, substrates on which films including a resist film have been formed by the first and the second processing block are transferred from the first and the second processing block to the transfer block, and the substrate is carried from the transfer block to the interface block by the direct carrying means.

In the coating and developing system according to the present invention, the substrate on which films including a resist film have been formed may be carried from the second processing block to the interface block by the substrate carrying means instead of carrying the substrate on which films including a resist film have been formed from the transfer block to the interface b lock by the second direct carrying means.

The first processing block may be provided with first transfer units stacked in layers in an area adjacent to the carrier block to transfer a substrate to and from the stacked unit blocks of the first processing block and to transfer a substrate between the first processing block and the carrier block, and a first transfer arm for carrying a substrate to and from the first transfer units.

The second processing block may be provided with second transfer units stacked up in layers in an area adjacent to the interface block to transfer a substrate to and from the stacked unit blocks of the second processing block and to transfer a substrate between the second processing block and the interface block, and a second transfer arm for carrying a substrate to and from the second transfer modules.

Each of the first and the second direct carrying means may include a forward direct carrying means for carrying a substrate from the carrier block toward the interface block, and a backward direct carrying means for carrying a wafer from the interface block toward the carrier block.

The unit blocks for forming a film of the same type may be disposed in the first and the second processing block on the opposite sides, respectively, of the transfer block so as to correspond to each other, and the substrate carrying mean of the unit blocks that form a film of the same type may carry a substrate to and from the common transfer units of the transfer block.

The film forming modules may include resist film forming unit blocks for forming a resist film on a substrate, and antireflection film forming unit blocks for forming an antireflection film on a substrate before or after a resist film has been formed on the substrate. The resist film forming unit blocks for forming a resist film on a substrate and the antireflection film forming unit blocks for forming an antireflection film on a substrate before or after a resist film has been formed on the substrate may be disposed adjacently and separated by the transfer block in the first and the second processing block, and the substrate carrying means of the unit blocks may transfer a substrate to and receive a substrate from the common transfer units.

The transfer block may be provided with stacked transfer units for the first processing block to transfer a substrate to and to receive a substrate from the film forming unit blocks of the first processing block, a transfer arm for the first processing block to carry a substrate to and from the transfer modules of the first processing block, stacked transfer units for the second processing block to transfer a substrate to and to receive a substrate from the film forming unit blocks of the second processing block, and a transfer arm for the second processing block to carry a substrate to and from the transfer units of the second processing block.

A coating and developing method according to the present invention for forming films including a resist film on a substrate carried in a carrier delivered to a carrier block by film forming unit blocks, carrying the substrate through an interface block to an exposure system after forming films including a resist film on the substrate, processing the substrate returned through the interface block from the exposure system by a developing process by a developing unit block, and transferring the substrate processed by the developing process to the carrier block, said coating and developing method includes the steps of: transferring a substrate by a transfer means included in the carrier block from the carrier block to a first direct carrying means included in a first processing block built by stacking up a plurality of unit blocks including a film forming unit block and connected to the carrier block; carrying the substrate by the first direct carrying means to a transfer block connected to the first processing block and to a second processing block built by stacking up a plurality of unit blocks including a film forming unit block; carrying the substrate to one of common transfer units, through which substrates are transferred to the film forming unit blocks of the first and the second processing block, stacked in layers in the transfer block by a transfer arm installed in the transfer block; transferring the substrates from the common transfer unit to the film forming unit block of the first processing block by a substrate carrying means installed in the film forming unit of the first processing block or to the film forming unit block of the second processing block by a substrate carrying means installed in the film forming unit of the second processing block; processing the substrate by a predetermined film forming process by the film forming module received the substrate; carrying the substrate on which a film has been formed by the substrate carrying means to the common transfer unit of the transfer block; and carrying the substrate from the common transfer module of the transfer block to the interface block by a second direct carrying means installed in the second processing block.

The coating and developing method according to the present invention may include the step of carrying the substrate by the substrate carrying means installed in the second processing block from the common transfer unit of the transfer block to the interface block instead of carrying the substrate by the second direct carrying means of the second processing block from the common transfer unit of the transfer block to the interface block.

A storage medium according to the present invention stores a computer program to be carried out by a coating and developing system that forms films including a resist film on a substrate received from a carrier block and processes the substrate processed by an exposure process by a developing process; wherein the program includes a set of instructions specifying the steps of the coating and developing method.

According to the present invention, the transfer block is interposed between the first and the second processing block to distribute substrates to the film forming modules of the first and the second processing block, a substrate if carried from the carrier block to the transfer block, and the substrate is delivered selectively to the film forming module of the first or the second processing block. The use of the two processing blocks can improve the throughput of the coating and developing system. Since the same carrying route is used for carrying a substrate to the film forming module of the first processing block and for carrying a substrate to the film forming module of the second processing block, the carrying program is easy to create.

DESCRIPTION OF THE PREFERRED EMBODIMENTS

Figure 1:
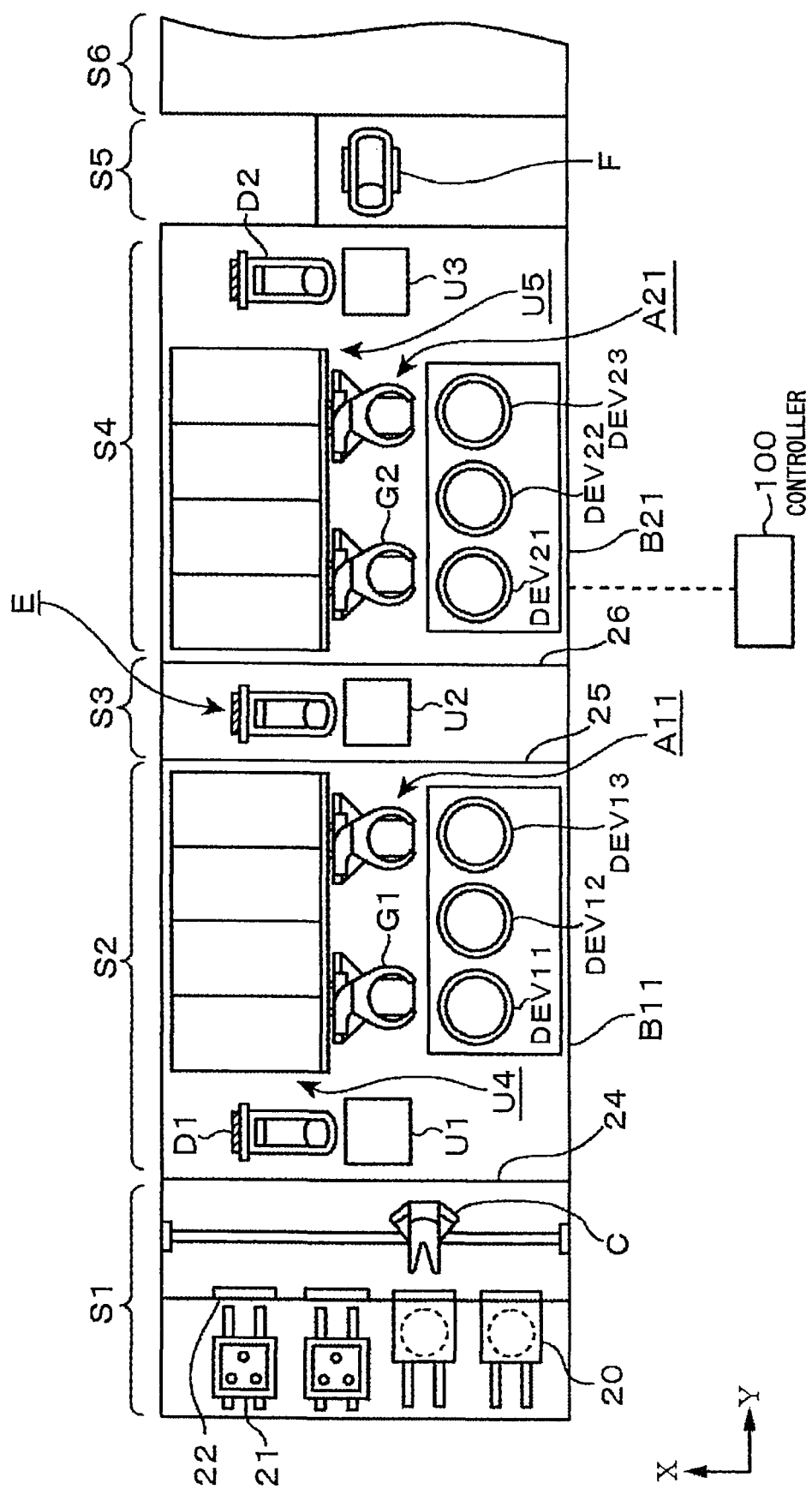
FIG. 1 is a plan view of a coating and developing system in a first embodiment according to the present invention.
Figure 2:
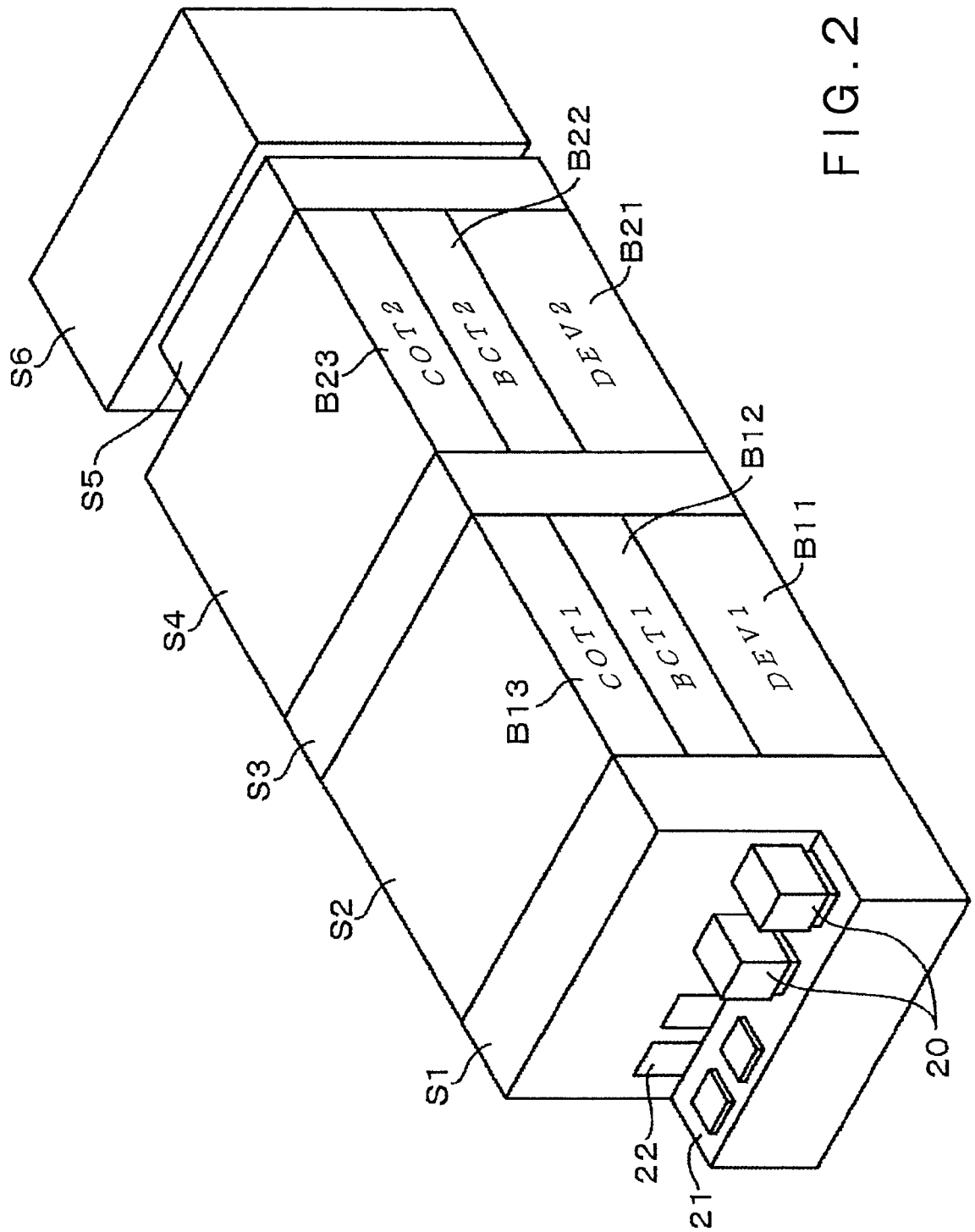
FIG. 2 is a perspective view of the coating and developing system shown in FIG. 1.
Figure 3:
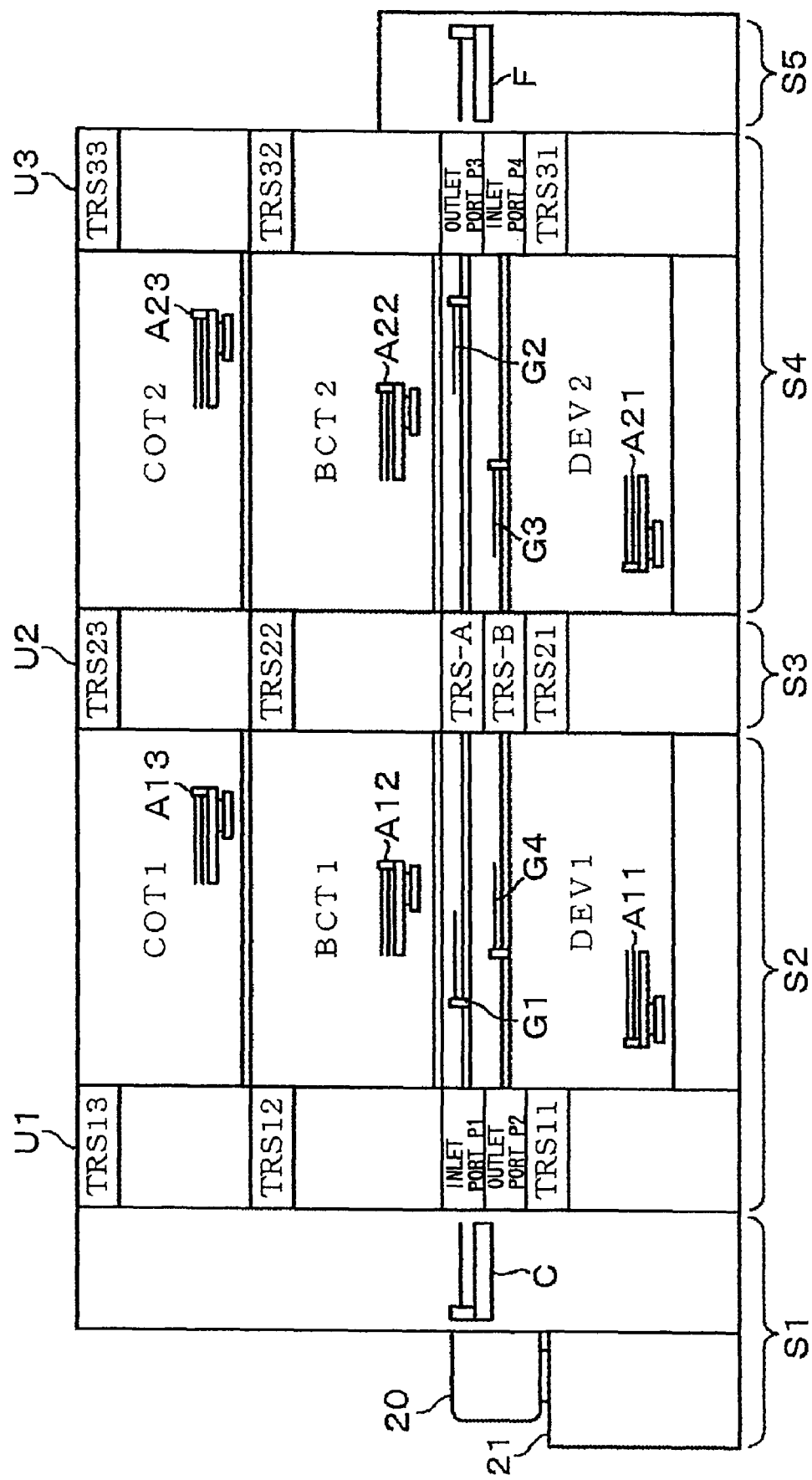
FIG. 3 is a sectional side elevation of the coating and developing system shown in FIG. 1.

Resist pattern forming systems in preferred embodiments of a coating and developing system according to the present invention will be described with reference to the accompanying drawings. FIGS. 1, 2 and 3 are a plan view, a schematic perspective view and a schematic side elevation, respectively, of a resist pattern forming system in a first embodiment according to the present invention. The resist pattern forming system has a carrier block S1 for receiving and sending out a carrier 20 containing, for example, thirteen wafers W, namely, substrates, in an airtight fashion, a first processing block S2, a transfer block S3, a second processing block S4, an interface block S5, and an exposure system S6.

The carrier block S1 is provided with a carrier platform 21 on which a plurality of carriers 20 are supported, a wall disposed behind the carrier platform 21 and provided with closable openings 22, and a transfer arm C, namely, a transfer means, for taking out a wafer W from the carrier 20 through the closable opening 22. The transfer arm C can move in longitudinal and vertical directions, can turn about a vertical axis, and can move laterally along a direction in which carriers 20 are arranged to carry a wafer W to and receive a wafer W from a transfer module TRS11, an inlet port P1 and an outlet port P2 included in a unit block B11.

The first processing block S2 surrounded by a box 24 is disposed behind and joined to the carrier block S1. The first processing block S2 is built by stacking, for example, three unit blocks B11, B12 and B13 in that order in a vertical arrangement. In this embodiment, the unit block B11 is a first developing layer (DEV1 layer) B11 for carrying out a developing process, the unit block B12 is a first antireflection film forming layer (BCT1 layer) B12 for forming an antireflection film underlying a resist film (hereinafter, referred to as "first antireflection film"), and the unit block B13 is a first film forming layer (COT1 layer) B13 for forming a resist film. The DEV1 layer B11, the BCT1 layer B12 and the COT1 layer B13 are demarcated individually. The BCT1 layer B12 and the COT1 layer B13 are film forming unit blocks.

The unit blocks B11, B12 and B13 are similar in construction. Each of the unit blocks B11, B12 and B13 is provided with wet-processing modules for applying a solution to a wafer W, various processing modules for processing a wafer W by a pretreatment before the wafer W is processed by the wet-processing module and processing the wafer W processed by the wet-processing module by a posttreatment, and main arms A11 to A13, namely, substrate carrying means, for carrying a wafer W to and from the wet-processing module, and the various processing modules.

As shown in FIGS. 1 and 3, a transfer shelf unit U1 is disposed in an area near the carrier block S1 in the unit blocks B11, B12 and B13. The transfer arm C and the main arms A11 to A13 can gain access to the transfer shelf unit U1. The transfer shelf unit U1 has a first transfer unit for each of the unit blocks. A wafer W is transferred to and from the other unit blocks or between the carrier block S1 and the first processing block S2 through the first transfer unit. A first transfer arm D capable of moving in longitudinal and vertical directions carries a wafer W to and receives a wafer W from the transfer units of the transfer shelf unit U1.

The construction of the COT1 layer B13 will be described as an example of that of the unit blocks B11 to B13 with reference to FIGS. 4 and 5. A carrying area R1 in which a wafer W is carried extends longitudinally, namely, in a Y-direction in FIGS. 4 and 5, in a substantially central part of the COT1 layer B13. A coating unit 31 provided with coating modules, namely, wet-processing modules, for coating a surface of a wafer W with a resist solution is disposed on the right-hand side, as viewed from the side of the carrier block S1, of the carrying area R1.

In the processing unit 31, a plurality of, for example, three coating modules COT11 to COT13 are arranged along the Y-direction in a processing vessel 30 so as to face the carrying area R1. Each of the coating modules COT11 to COT13 pours a resist solution, namely, a coating solution, through a common pouring nozzle onto a wafer W held by suction in a horizontal position on, for example, a spin chuck, spreads the resist solution over the surface of the wafer W by rotating the wafer W to coat the surface of the wafer W with a resist solution film. The processing vessel 30 is provided with openings 33A to 33C (FIG. 5) at positions respectively corresponding to the coating modules COT11 to COT13. The main arm A13 carries a wafer W to and receives a wafer W from the coating modules COT1 to COT13 through the openings 33A to 33C.

A shelf unit U4 is disposed opposite to the coating unit 31 with respect to the carrying area R1. The shelf unit U4 has processing modules arranged in two layers and four rows. The processing modules shown in FIGS. 4 and 5 are those for carrying out pretreatments to which a wafer W is subjected before the same is processed by the coating unit 31 and for carrying out posttreatments to which a wafer is subjected after the same has been processed by the coating unit 31. The processing modules include heating and cooling modules LHP for heating a wafer W coated with a resist solution film and cooling the heated wafer W, temperature adjusting modules CPL for adjusting the temperature of a wafer W to a predetermined temperature, and edge exposure modules WEE.

The heating and cooling module LHP is provided with a heating plate 34 for heating a wafer W supported thereon, and a cooling plate 35 serving also as a carrying arm. The cooling plate 35 transfers a wafer W between the main arm A13 and the heating plate 34. The heating and cooling module LHP is formed by combining a heating module and a cooling module. The heating module and the cooling module may be built separately. The temperature adjusting module CPL is provided, for example, with a water-cooled cooling plate. As shown in FIG. 5, each of those modules including the heating and cooling modules LHP and the temperature adjusting modules CPL is contained in a processing vessel 36 having a front wall facing the carrying area R1 and provided with an opening 37 through which a wafer W is carried into and out of the processing vessel 36.

The shelf unit U1 of the COT1 layer B13 has a transfer module TRS13. The main arm A13 of the COT1 layer B3 and the first transfer arm D1 can access the transfer module TRS13. In this embodiment, the transfer module TRS13 is provided with a plurality of support projections, for example three support projections for supporting a wafer W thereon. The three support projections are arranged so as not to interfere with the main arm A13 and the transfer arm U1 when they move into the transfer module TRS13.

The main arm A13 installed in the carrying are R1 will be described. The main arm A13 can carry a wafer W to and receive a wafer W from all the modules, in which a wafer W is placed, in the COT1 layer B13, such as the coating modules COT11 to COT13, and the transfer module TRS13 of the shelf unit U1, the processing modules of the shelf unit U4, and a transfer module TRS23 included in the transfer block S3. The main arm A13 can move forward and backward, can vertically move, can turn about a vertical axis and can move in directions parallel to the Y-direction.

Figure 4:
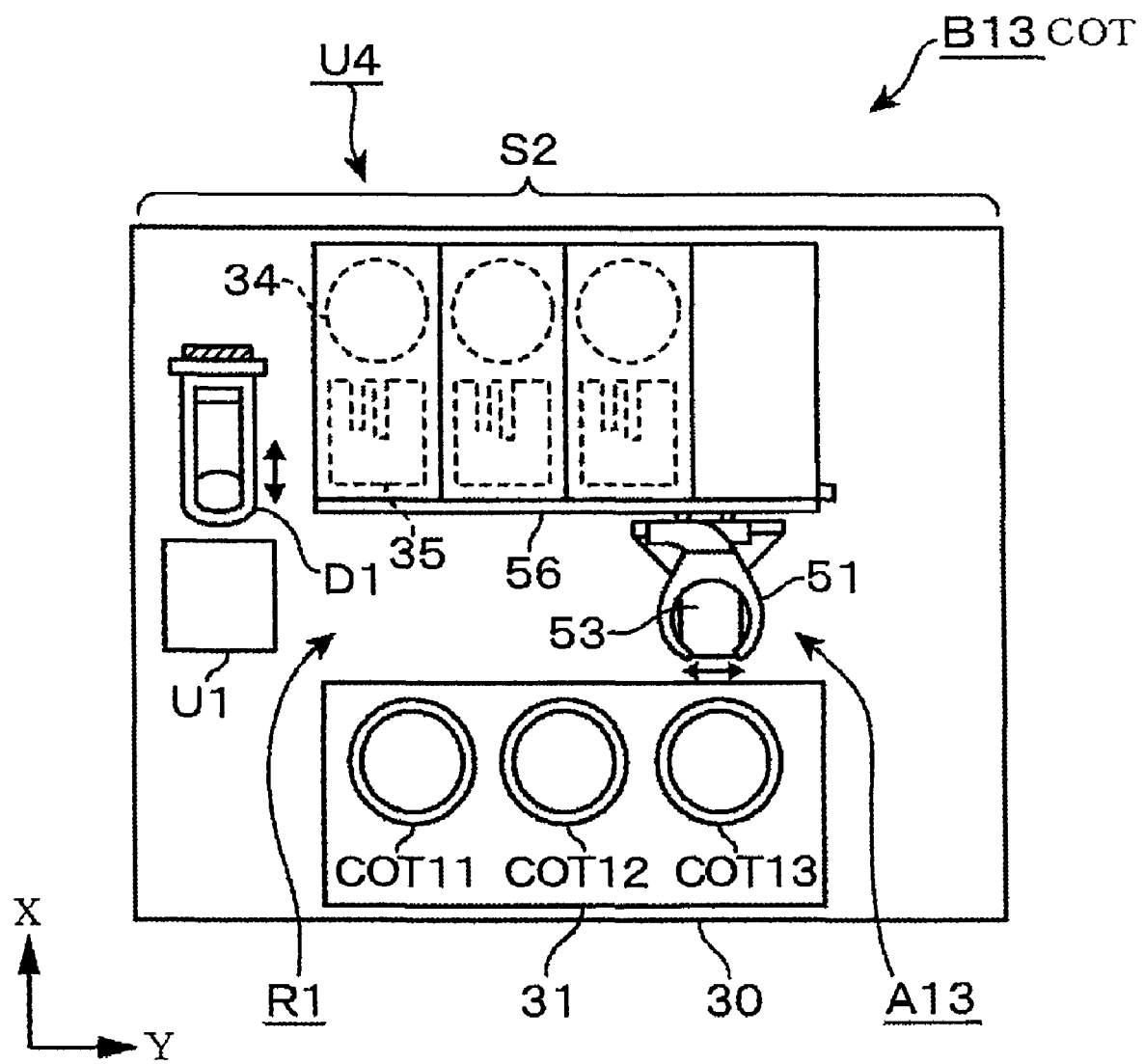
FIG. 4 is a plan view of modules of a COT1 layer included in the coating and developing system shown in FIG. 1.
Figure 5:
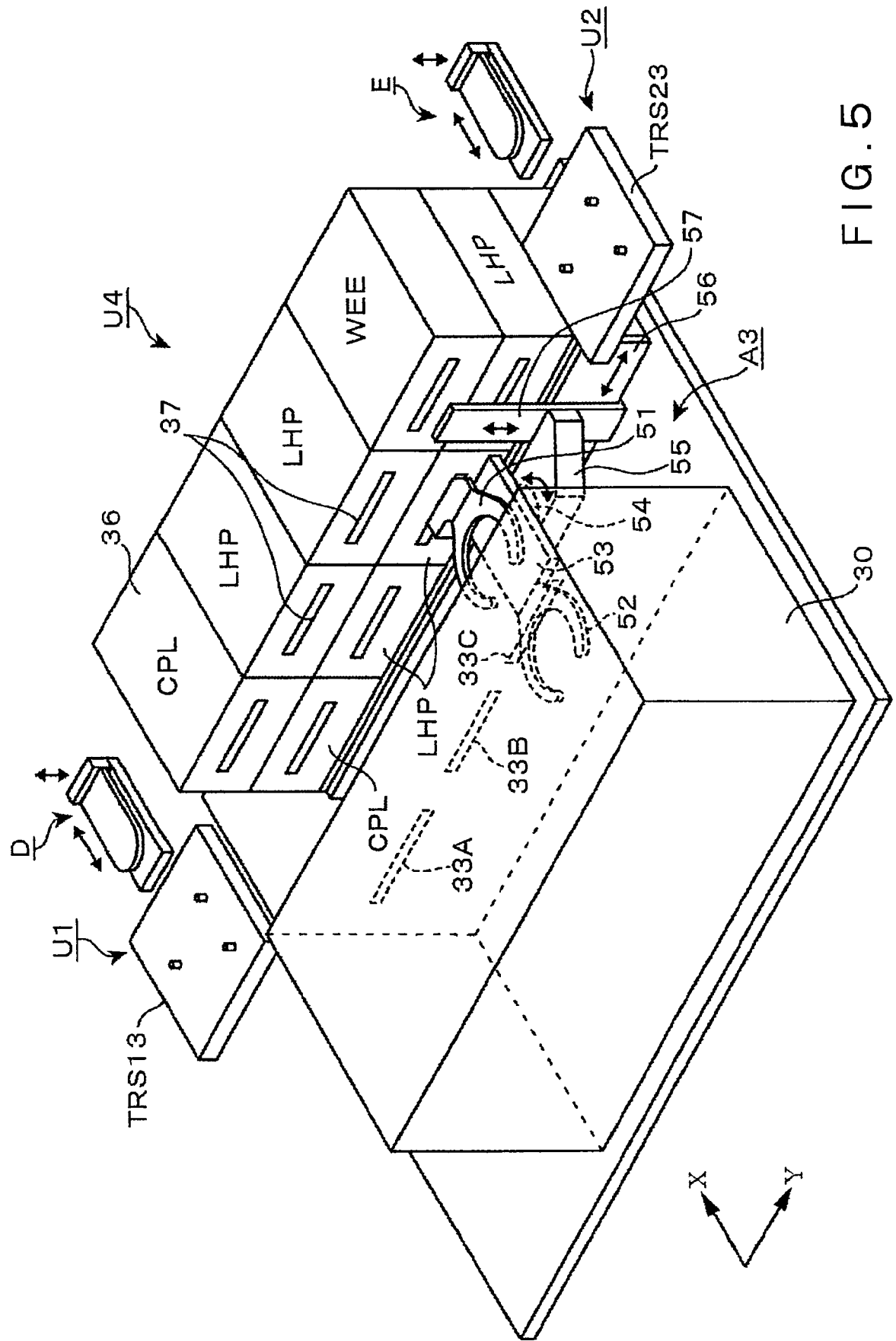
FIG. 5 is a perspective view of the modules of the COT1 layer.

Referring to FIGS. 4 and 5, the main arm A13 has two support arms 51 and 52 on which peripheral areas of the back surface of a wafer W are seated. The support arms 51 and 52 can individually move forward and backward on a base plate 53. The base plate 53 is supported on a traveling base 55 so as to be turned about a vertical axis by a turning mechanism 54. Shown also in FIGS. 4 and 5 are a guide rail 56 extended along the length of the carrying area R1 parallel to the Y-direction, a vertical guide rail 57 along which the traveling base 55 move vertically. A lower end part of the vertical guide rail 57 extends vertically down below the guide rail 56. The vertical guide rail 57 moves longitudinally parallel to the Y-direction along the guide rail 56 to move the traveling base 55 longitudinally along the carrying area R1. The vertical guide rail 57 connects to the traveling base 55 at a position separated by a distance from a position where the support arms 51 and 52 move forward and backward to avoid the vertical guide rail 57 interfering with the support arms 51 and 52.

Other unit blocks will be briefly described. The BCT1 layer B12 is similar in construction to the COT1 layer B13. The BCT1 layer B12 has a first antireflection film forming processing unit including a plurality of, for example, three, first antireflection film forming modules BCT11 to BCT13 for forming a first antireflection film by applying a coating solution for forming the first antireflection film to a wafer W, a shelf unit U4 including heating and cooling modules LHP for heating a wafer processed by an antireflection film forming process on a heating plate by a heating process and cooling the heated wafer W by a cooling plate by a cooling process, and temperature adjusting modules CPL for adjusting the temperature of a wafer W to a predetermined temperature. The shelf unit has a transfer module TRS12, namely, a first transfer unit, disposed so that the first transfer arm D1 can access the transfer module TRS12. The main arm A12 carries a wafer W between each of the modules including those of the first antireflection film forming layer BCT1 and those of the shelf units U1 and U4, and a transfer module TRS22 included in the transfer block S3.

Figure 13:
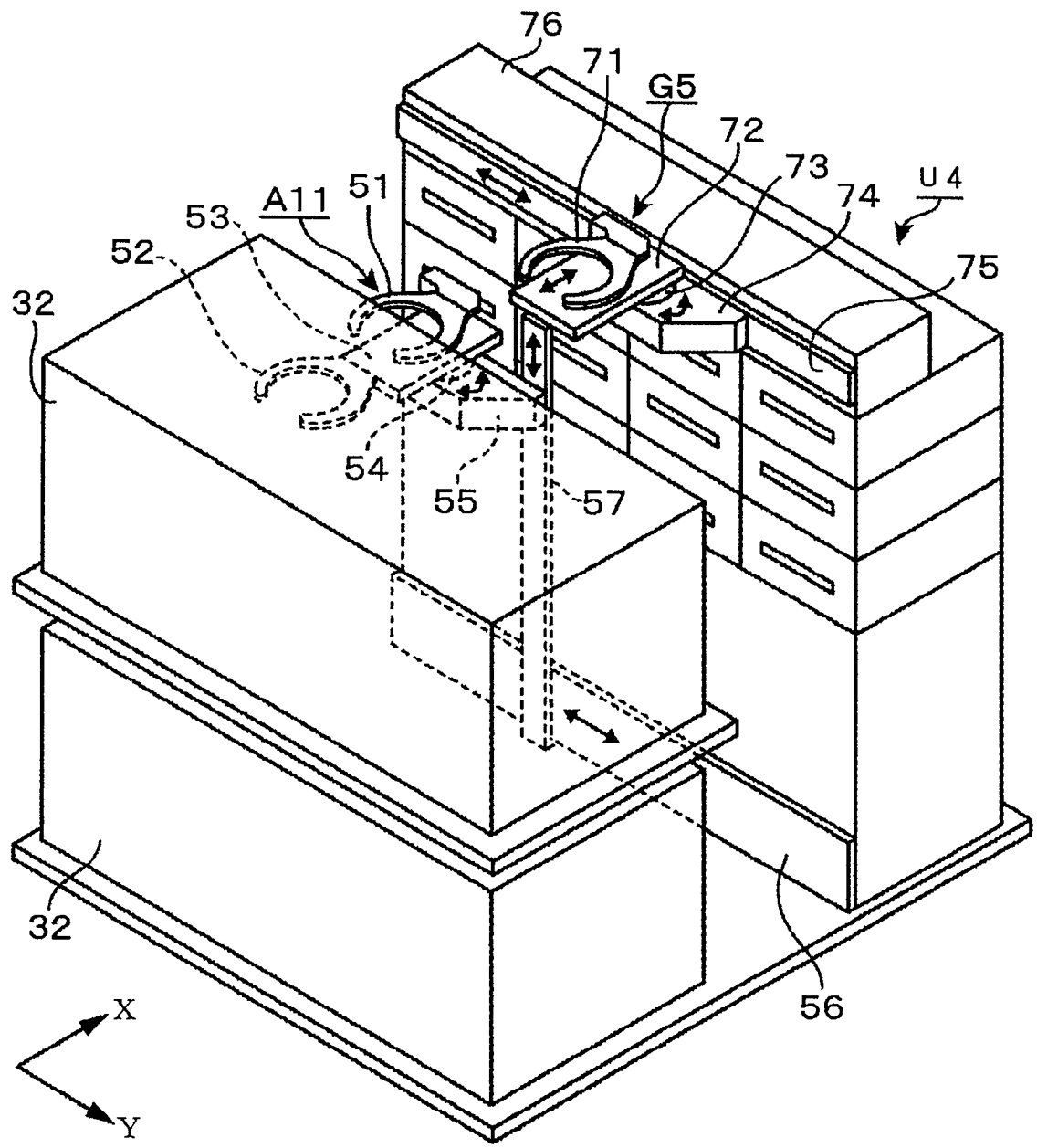
FIG. 13 is a perspective view of assistance in explaining a shuttle arm included in the coating and developing system shown in FIG. 10.

Referring to FIGS. 3 and 13, the DEV1 layer B11 is substantially similar to the COT1 layer B13, except that the DEV1 layer B11 includes a shelf unit U4 having processing modules arranged in three layers and four rows, and shuttle arms G1 and G4. Developing units 32 for processing a wafer W by a developing process using a developer are stacked in two layers. Each of the developing units 32 has, for example, three developing modules DEV11 to DEV13, namely, wet-processing modules.

A shelf unit U4 is provided with a heating module PEB, namely, postexposure baking module for processing a wafer W processed by an exposure process by a heating process, a cooling module COL for adjusting the temperature of a wafer W processed by the heating module PEB to a predetermined temperature, heating modules POST for processing a wafer W processed by the developing process by a heating process to dry the wafer W, namely, postbaking modules, and temperature adjusting modules CPL for adjusting the temperature of a wafer W processed by the heating module POST to a predetermined temperature. A first antireflection film forming unit and the developing unit 32 are substantially similar in construction to the coating unit 31.

The shelf unit U1 is provided with a transfer module TRS11, namely, first transfer unit. The main arm A11 carries a wafer W to and receives a wafer W from the developing modules DEV11 to DEV13, the modules in the shelf units U1 and U4, a transfer module TRS21 included in the transfer block S3. The shelf unit U1 is provided with a first transfer unit including an inlet port P1 and an outlet port P2 for receiving a wafer W from and sending out a wafer W to the carrier block S1. The inlet port P1 and the outlet port P2 are used in combination exclusively with the shuttle arms G1 and G4, respectively.

The transfer block S3 surrounded by a box 25 is disposed behind and connected to the first processing block S2. The second processing block S4 surrounded by a box 26 is disposed behind and connected to the transfer block S3. The second processing block S4 will be described. The second processing block S4 is similar in construction to the first processing block S2, except that the second processing block S4 has a transfer shelf unit U3 disposed near the interface block S5.

The second processing block S4 is built by stacking unit blocks B21, B22 and B23 in that order in a vertical arrangement. The unit block B21 is a second developing layer (DEV2 layer) B21 for carrying out a developing process, the unit block B12 is a second antireflection film forming layer ((BCT2 layer) B22 for forming a first antireflection film, and the unit block B23 is a second film forming layer (COT2 layer) B23 for forming a resist film. The BCT2 layer B22 and the COT1 layer B23 are film forming unit blocks. The transfer shelf unit U3 has second transfer parts stacked in layers for transferring a wafer W to and from the unit blocks B21 to B23 of the second processing block S4, and transferring a wafer W between the second processing block S4 and the interface block S5.

The unit blocks B21 to B23 of the second processing block S4 will be briefly described. As mentioned above, the shelf unit U3 is disposed on the side of the interface block S5. The DEV2 layer B21, the BCT2 layer B22 and the COT2 layer B23 are similar in construction to the DEV1 layer 11, the BCT1 layer B12 and the COT1 layer B13, respectively. The COT2 layer B23 is provided, similarly to the COT1 layer B13, with three coating modules COT21 to COT23, namely, wet-processing modules, for applying a resist solution to a wafer W. A shelf unit U5 is provided with heating and cooling modules LHP, temperature adjusting modules CPL, and edge exposure modules WEE. The shelf unit U3 has a transfer module TRS33 disposed such that a second transfer arm D2 can access the transfer module TRS33. A main arm A23 carries a wafer W to and receives a wafer W from the coating modules COT21 to COT23, and the shelf units U3 and U5.

The BCT2 layer B22 is provided with, for example, three first antireflection film forming modules BCT21 to BCT23 for forming a first antireflection film. The shelf unit U5 is provided with heating and cooling modules LHP and temperature adjusting modules CPL. The shelf unit U3 has a transfer module TRS32 disposed such that the second transfer arm D2 can access the transfer module TRS32. A main arm A22 carries a wafer W to and receives a wafer W from the first antireflection film forming modules BCT21 to BCT23, and the modules included in the shelf units U3 and U5.

The DEV2 layer 21 is provided with, for example, three developing modules DEV21 to DEV23 for processing a wafer W by a developing process. The shelf unit U5 is provided with heating modules PEB, cooling modules COL, heating modules POST, and temperature adjusting modules CPL. The shelf unit U3 has a transfer module TRS31, namely, a second transfer part, disposed such that an interface arm F and the second transfer arm D2 can access the transfer module TRS31. A main arm A21 carries a wafer W to and receives a wafer W from the developing modules DEV21 to DEV23, and the modules of the shelf units U3 and U5.

The shelf unit U3 is provided with an outlet port P3 and an inlet port P4, namely, transfer parts, disposed such that the interface arm F and the second transfer arm D2 can access the outlet port P3 and the inlet port P4. The outlet port P3 and the inlet port P4 are used in combination exclusively with the shuttle arms G2 and G3, respectively.

The transfer block S3 will be described. A wafer W is transferred through the transfer block S3 between the first processing block S2 and the second processing block S4. Referring to FIGS. 1 and 3, the transfer block S3 is provided with a shelf unit U2 disposed such that the main arms A11 to A13 of the unit blocks B11 to B13 of the first processing block S2, and the main arms A21 to A23 of the unit blocks B21 to B23 of the second processing block S4 can access the shelf unit U2. The shelf unit U2 is provided with a common transfer module for each of the unit blocks to send a wafer W to and receive a wafer W from other unit blocks, and a transfer arm E for transferring a wafer W to and receiving a wafer W from the common transfer modules of the shelf unit U2. The transfer arm E can move forward and backward, and can vertically move.

As shown in FIG. 3, the BCT1 layer B12 of the first processing block S2 and the BCT2 layer B22 of the second processing block S4, the COT1 layer B13 of the first processing block S2 and the COT2 layer B23 of the second processing block S4, and the DEV1 layer B11 of the first processing block S2 and the DEV2 layer B21 of the second processing block S4 are on the opposite sides, respectively, of the transfer block S3 so as to correspond to each other. Thus the main arms of the unit blocks for carrying out the same process can access the same common transfer module of the transfer block S3.

More concretely, the respective main arms A13 and A23 of the COT1 layer B13 and the COT2 layer B23 can access a transfer module TRS23, the respective main arms A12 and A22 of the BCT1 layer B12 and the BCT2 layer B22 can access a transfer module TRS22, the respective main arms A11 and A21 of the DEV1 layer B11 and the DEV2 layer B21 can access a transfer module TRS21. The respective shuttle arms G1 and G2 of the DEV1 layer B11 and the DEV2 layer B 21 can access a transfer module TRS-A. The respective shuttle arms G3 and G4 of the DEV1 layer B11 and the DEV2 layer B21 can access a transfer module TRS-B.

The transfer modules TRS11 to TRS33 of the shelf units U1, U2 and U3 are the same in construction as the abovementioned transfer module TRS13. The transfer arms D1, D2 and E for carrying a wafer W to and receiving a wafer from the transfer modules TRS11 to TRS33 are the same in construction.

The interface block S5 disposed behind the shelf unit U3 and is connected to the second processing S4, and the exposure system S6 is connected to the interface block S5. The interface block S5 is provided with the interface arm F to transfer a wafer W to and to receive a wafer W from the second transfer parts of the shelf unit U3 of the second processing block S4 and the exposure system S6. The interface arm F can move forward and backward, can vertically move and can turn about a vertical axis.

Figure 6:
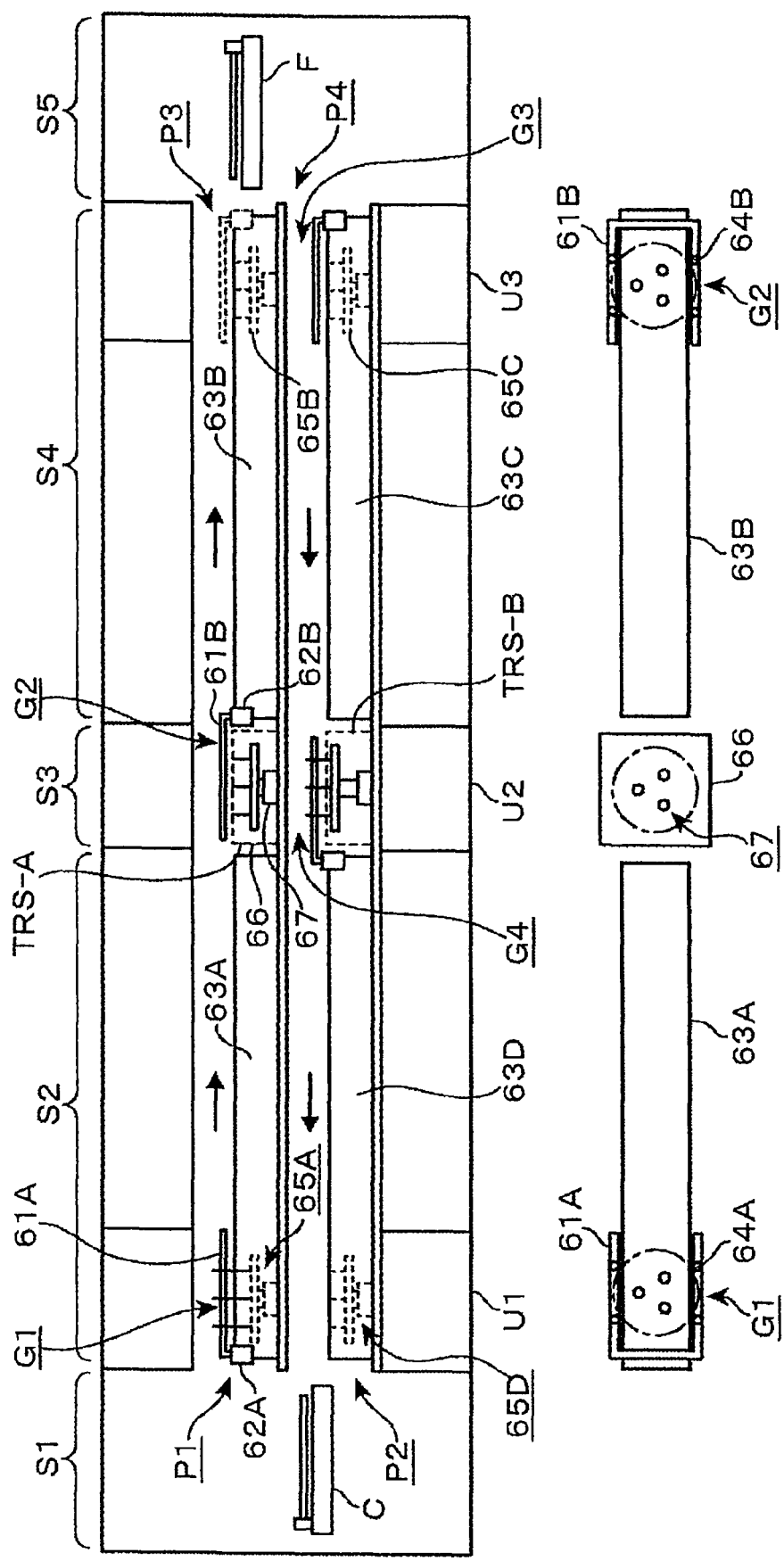
FIG. 6 shows a shuttle arm included in the coating and developing system shown in FIG. 1 in a sectional view and a plan view.

The shuttle arms G1 to G4 will be described with reference to FIGS. 3 and 6. The shuttle arms G1 and G2 are forward direct carrying devices exclusively for carrying a wafer W forward from the carrier block S1 toward the interface block S5. The shuttle arms G3 and G4 are backward direct carrying devices exclusively for carrying a wafer W backward from the interface block S5 toward the carrier block S1.

First the shuttle arm G1 will be described. A drive mechanism 62A moves an arm 61A on which a peripheral part of the back surface of a wafer W is seated along a base plate 63A extended in a direction along the length of the first processing block s2, namely, the Y-direction in FIG. 1. In FIG. 6, indicated at 64A is a positioning member for correctly positioning a wafer W on the arm 61A.

The base plate 63A has opposite first and second ends. The first end of the base plate 63A lies in an area adjacent to the carrier block S1 such that the arm 61A can be located at a first transfer position where a wafer W is transferred between the arm 61A and the transfer arm C of the carrier block S1. The second end of the base plate 63A lies in an area adjacent to the transfer block S3 such that the arm 61A can be located at a second transfer position where a wafer W is transferred between the arm 61A and the transfer module TRS-A of the transfer block S3.

A lifting mechanism 65A is disposed in the first end of the base plate 63A such that the transfer arm C can access the lifting mechanism 65A. When the arm 61A is moved to the first transfer position as shown in FIG. 6, the lifting mechanism 65A moves up into and moves down out of a space inside the arm 61A to transfer a wafer W between the transfer arm C and the shuttle arm G1.

The shuttle arm G2 will be described. Shown in FIG. 6 are an arm 61B, a base plate 63B extending in a direction parallel to the length of the second processing block S4, namely, the Y-direction in FIG. 1, a drive mechanism 62B, and a positioning member 64B. The base plate 63B has opposite first and second ends. The first end of the base plate 63B lies in an area adjacent to the transfer block S3 such that the arm 61B can be located at a third transfer position where a wafer W is transferred between the arm 61B and the transfer module TRS-A of the transfer block S3. The second end of the base plate 63B lies in an area adjacent to the interface block S5 such that the arm 61B can be located at a fourth transfer position where a wafer W is transferred between the arm 61B and the interface arm F of the interface block S3.

A lifting mechanism 65B is disposed in the second end of the base plate 63B such that the interface arm F can access the lifting mechanism 65B. As shown in FIG. 6, when the arm 61B is moved to the fourth transfer position, the lifting mechanism 65B moves up into and moves down out of a space inside the arm 61B to transfer a wafer W between the interface arm F and the shuttle arm G2.

The transfer module TRS-A is provided with a transfer stage 66, and a lifting mechanism 67 built in the transfer stage 66. As shown in FIG. 6, when the arm 61A of the shuttle arm G1 is at the second transfer position, the lifting mechanism 67 moves up into and moves down out of a space inside the arm 61A to transfer a wafer W between the shuttle arm G1 and the transfer arm E. When the arm 61B of the shuttle arm G2 is moved to the third transfer position, the lifting mechanism 67 moves up into and moved down out of a space inside the arm 61B to transfer a wafer W between the transfer arm E and the shuttle arm G2.

The lifting pins of the lifting mechanism 67 are arranged so that the lifting pins may not interfere with the transfer arm E when a wafer W is transferred between the transfer arm E of the transfer block S3 and the transfer module TRS-A. For example, the lifting pins are projected from the transfer stage 66, and the transfer arm E is moved vertically relative to the lifting pins to transfer a wafer W between the transfer module TRS-A and the transfer arm E.

The shuttle arms G1 and G2 are used for carrying a wafer W in a first direction from the carrier block S1 toward the interface block S5. The first end of the base plate 63A serves as an inlet port P1 of the first transfer part, and the second end of the base plate 63B serves as the outlet port P3 of the second transfer part.

The shuttle arms G3 and G4 are similar in construction to the shuttle arms G1 and G2. A lifting mechanism 65D is combined with a first end of a base plate 63D along which the shuttle arm G4 moves. The first end of the base plate 63D serves as the outlet port P2. A lifting mechanism 63C is combined with a second end of a base plate 63C along which the shuttle arm G3 moves. The second end of the base plate 63C is serves as the inlet port P4 where a wafer W is transferred between the interface arm F and the shuttle arm G3. A wafer W is transferred between the shuttle arms G3 and G4 through the transfer module TRS-B of the transfer block S3. The transfer module TRS-B is similar in construction to the transfer module TRS-A.

The resist pattern forming system is provided with a controller 100 comprising a computer. The controller 100 controls the management of recipes for the processing modules, the management of recipes specifying the flow of a wafer W, namely, carrying routes, processes to be executed by the processing modules, driving operations for driving the main arms A11 to A13, and A21 to A23, the transfer arm C, the first transfer arm D1, the second transfer arm D2, the transfer arm E, the shuttle arms G1 to G4, and the interface arm F. The controller 100 is provided with a storage device for storing programs, such as computer programs. The storage device stores programs, namely, pieces of software, including a set of instructions specifying the general operations of the resist pattern forming system, namely, procedures of processes to be executed by the processing modules, and carrying operations for carrying a wafer W. The controller 100 reads those programs from the storage device and controls the general operations of the resist pattern forming system according to the programs. The programs are stored in a storage medium, such as a flexible disk, a hard disk, a compact disk, a magnetooptical disk or a memory card, and the storage medium is held in the storage device.

Figure 7:
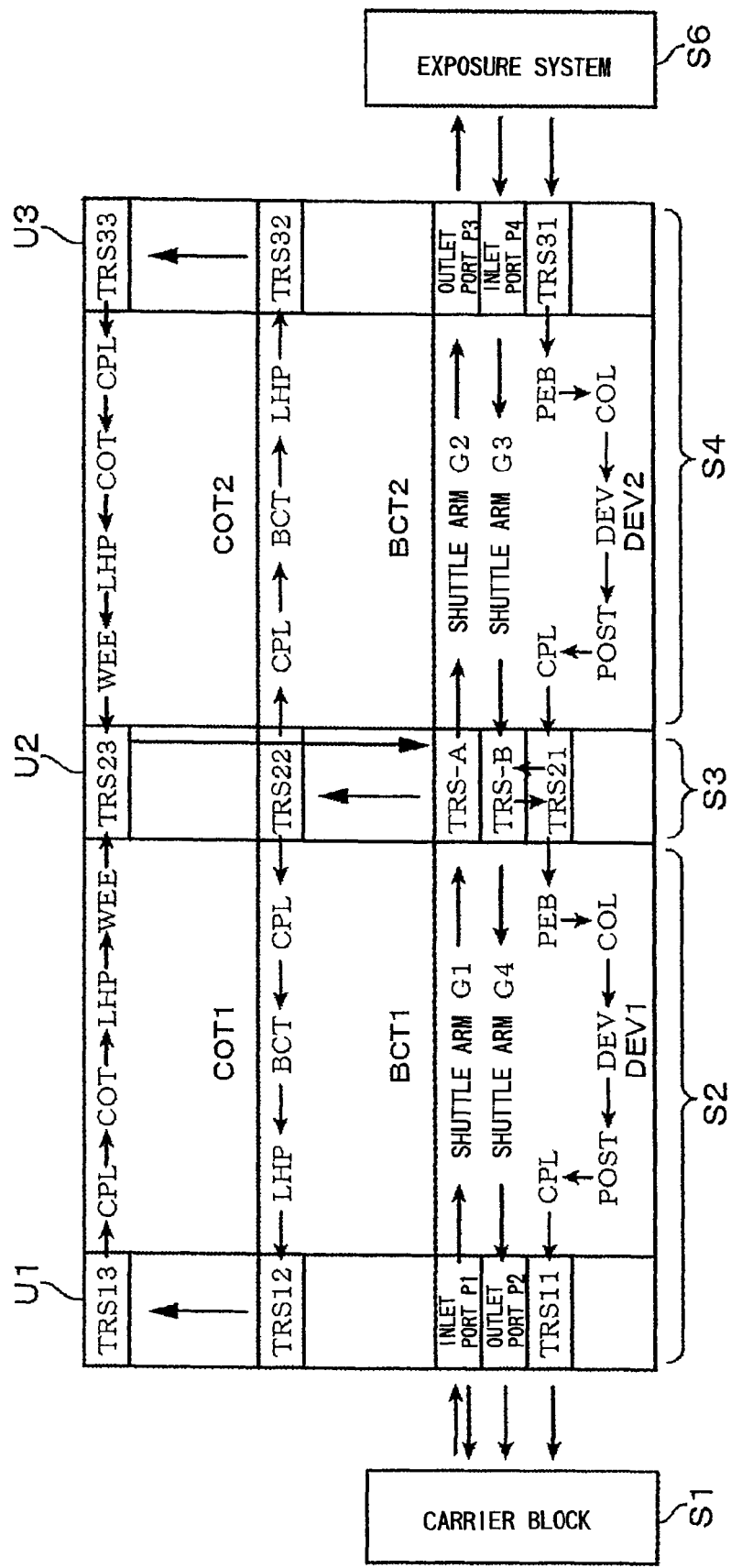
FIG. 7 is a side elevation of assistance in explaining carrying passages along which a wafer W is carried in the coating and developing system shown in FIG. 1.

A carrying route for carrying a wafer W in the resist pattern forming system to form a resist film on a first antireflection film will be described by way of example with reference to FIG. 7. The controller 100 controls the main arms A11 to A13, and A21 to A23, the transfer arm C, the first transfer arm D1, the second transfer arm D2, the transfer arm E, the shuttle arms G1 to G4, and the interface arm F on the basis of a recipe specifying a carrying flow (carrying route) to carry the wafer W in the resist pattern forming system.

The transfer arm C takes out a wafer W from a carrier 20 delivered to the carrier block S1 and transfers the wafer to the shuttle arm G1 in the inlet port P1. The shuttle arm G1 carries the wafer W to the transfer module TRS-A of the transfer block S3. Then, the transfer arm E carries the wafer W from the transfer module TRS-A to the transfer module TRS22. Subsequently, the main arm A12 or the main arm A22 carries the wafer W from the transfer module TRS22 to the BCT1 layer of the first processing block S2 or the BCT2 layer of the second processing block S4.

In the first processing block S2, the main arm A12 carries the wafer W from the BCT1 layer along a route passing the temperature adjusting module CPL, the first antireflection film forming module BCT, the heating module LHP, and the transfer module TRS12 of the shelf unit U1 in that order. Thus a first antireflection film is formed on a surface of the wafer W.

Then, the first transfer arm D1 carries the wafer W from the transfer module TRS12 to the transfer module TRS13. Then, the main arm A13 carries the wafer W to the COT1 layer. In the COT1 layer, the wafer W is carried along a route passing the temperature adjusting module CPL, the coating module COT, the heating module LHP, the edge exposure module WEE, and the transfer module TRS23 of the transfer block S3. Thus a resist film is formed on the first antireflection film.

When the wafer W is transferred to the BCT2 layer of the second processing block S4, the main arm A22 carries the wafer W from the BCT2 layer along a route passing the temperature adjusting module CPL, the first antireflection film forming module BCT, the heating module LHP, and the transfer module TRS32 of the shelf unit U3 in that order. Thus a first antireflection film is formed on a surface of the wafer W.

Then, the first transfer arm D2 carries the wafer W from the transfer module TRS32 to the transfer module TRS33. Then, the main arm A23 carries the wafer W to the COT2 layer. In the COT2 layer, the wafer W is carried along a route passing the temperature adjusting module CPL, the coating module COT, the heating module LHP, the edge exposure module WEE, and the transfer module TRS23 of the transfer block S3. Thus a resist film is formed on the first antireflection film.

The wafers W respectively processed by the first processing block S2 and the second processing block S4 to form the first antireflection film and the resist film thereon are collected in the transfer module TRS23 of the transfer block S3. Then, the shuttle arm G2 carries the wafer W to the outlet port P3 of the shelf unit U3, the interface arm F carries the wafer W to the exposure system S6 to process the wafer W by a predetermined exposure process.

A carrying route along which the wafer W processed by the exposure process will be described on an assumption that the wafer W is to be subjected to a developing process in the first processing block S2. The interface arm F carries the wafer W processed by the exposure process to the inlet port P4 and transfers the wafer W top the shuttle arm G3. Then, the shuttle arm G3 carries the wafer W to the transfer module TRS-B of the transfer block S3. Subsequently, the transfer arm E carries the wafer from the transfer module TRS-B to the transfer module TRS21. Then, the main arm A11 carries the wafer W from the transfer module TRS21 to the DEV1 layer of the first processing block S2.

In the DEV1 layer, the wafer W is carried along a route passing the heating module PEB, the cooling module COL, the developing module DEV, the heating module POST, the temperature adjusting module CPL, and the transfer module TRS11 of the shelf unit U1. Thus the wafer W is processed by a predetermined developing process. The transfer arm C carries the wafer W processed by the developing process from the transfer module TRS11 to return the wafer W into the carrier 20 held in the carrier block S1.

When the wafer W is processed by the developing process in the second processing block S4, the interface arm F carries the wafer W processed by the exposure process to the transfer module TRS31. Then, the main arm A21 carries the wafer W to the DEV2 layer of the second processing block S4. In the DEV2 layer, the wafer W is carried along a route passing the heating module PEB, the cooling module COL, the developing module DEV, the heating module POST, the temperature adjusting module CPL, and the transfer module TRS21 of the transfer block S3. Thus the wafer W is processed by a predetermined developing process.

Subsequently, the transfer arm E carries the wafer W to the transfer module TRS-B. Then, the shuttle arm G4 carries the wafer W to the outlet port P2 of the shelf unit U1. Thus the wafer W processed by the developing process is transferred from the shuttle arm G4 to the transfer arm C in the outlet Port P2. The transfer arm C returns the wafer W into the carrier 20 held in the carrier block S1.

Thus the throughput of the resist pattern forming system can be improved. Each of the unit blocks B11 to B13 of the first processing block S2 and the unit blocks B21 to B23 of the second processing block S4 has, for example, the three wet-processing modules and the processing modules respectively corresponding to the wet-processing modules. Therefore, the throughput of each of the two processing blocks S2 and S4 are approximately equal to that of the conventional resist pattern forming system previously mentioned in the description of the related art. Since the resist pattern forming system of the present invention has the one processing block in addition to the processing block corresponding to that of the conventional resist pattern forming system, the throughput of the resist pattern forming system of the present invention is improved accordingly.

The number of the modules in each of the first processing block S2 and the second processing block S4 is substantially equal to that of the modules of the conventional resist pattern forming system. Therefore, loads on the main arms A11 to A13 of the unit blocks B11 to B13, and the main arms A21 to A23 of the unit blocks B21 to B23 are not increased and hence carrying efficiency will not be reduced.

The first transfer arm D1, the second transfer arm D2, the main arms A11 to A13, and the main arm A21 to A23 are used for carrying a wafer W to and from the unit blocks B11 to B13 and B21 to B23 in the first processing block S2 and the second processing block S4. The shuttle arm G1 and the transfer arm E are used for carrying a wafer W from the carrier block S1 to the first processing block S2 or the second processing block S4. The transfer arm E and the shuttle arm G2 are used for carrying a wafer W from the first processing block S2 or the second processing block S4 to the interface block S5. The shuttle arms G3 and G4 are used for carrying a wafer W from the interface block S5 to the transfer block S3, and from the transfer block S3 to the carrier block S1.

Carrying work for carrying a wafer W is shared among the main arms A11 to A13 of the first processing block S2, the main arms A21 to A23 of the second processing block S4, the first transfer arm D1, the second transfer arm D2, and the shuttle arms G1 to G4. Therefore, a load on each arm is reduced and the reduction of throughput can be suppressed.

Wafers W are carried from the carrier block S1 to the transfer block S3, and then the transfer block S3 distributes the wafers W to the first processing block S2 and the second processing block S4. Since the wafer W is carried into the first processing block S2 from behind the first processing block S2, it is considered that carrying a wafer to the first processing block S2 and carrying efficiency is reduced. However, since the shuttle arms G1 and G2 are used exclusively for carrying a wafer W forward from the carrier block S1 toward the interface block S5, and the shuttle arms G3 and G4 are used exclusively for carrying a wafer W backward from the interface block S5 toward the carrier block S1, the carrier arm G1 is used only for carrying a wafer W from the carrier block S1 to the transfer block S3. Thus it is possible that the carrying efficiency is reduced scarcely.

The shuttle arms G1 to G4 move only horizontally on the base plates 63A to 63D, respectively, and the lifting mechanism 65A to 65D are used for transferring a wafer W. Therefore, the shuttle arms G1 to G4 can be driven and controlled more easily than shuttle arms respectively provided with lifting mechanisms, and the lightweight shuttle arms G1 to G4 are expected to operate at an increased carrying speed.

A carrying program for the resist pattern forming system of the present invention is easy to create. Even though the resist pattern forming system is provided with the two processing blocks, namely, the first processing block S2 and the second processing block S4, a wafer W to be processed by the exposure process is carried from the carrier block S1 to the transfer block S3, and the wafer W is distributed selectively to the BCT1 layer of the first processing system S2 or the BCT2 layer of the second processing system S4.

A wafer W is carried from the carrier block S1 to the BCT1 layer or the BCT2 layer along the same carrying route. Therefore, wafers W are not carried to the processing blocks S2 and S4 in different carrying modes using different arms, such as a carrying mode not using the carrying arm G1 for carrying a wafer W to the first processing blocks S2 adjacent to the carrier block S1, and a carrying mode using the arm G1 for carrying a wafer W to the second processing block S4, and hence wafers W are carried from the carrier block S1 to the first processing block S2 and the second processing block S4 by the same number of carrying steps. Thus the carrying program is easy to create.

Wafers W are carried from the BCT1 layer to the COT1 layer in the first processing block S2, and from the BCT2 layer to the COT2 layer in the second processing block S4 individually, and the wafers W processed by the COT1 layer and the COT2 layer are collected in the transfer block S3. Therefore, a carrying operation for carrying a wafer W along a carrying route in the first processing block S2, and a carrying operation for carrying a wafer W along a carrying route in the second processing block S4 can be individually controlled and hence the carrying program is easy to create.

Wafers W coated with a resist film are collected temporarily in the transfer block S3 and are carried from the transfer block S3 to the interface block S5. Wafers W respectively processed by the first processing block S2 and the second processing block S4 are carried along the same carrying route from the first processing block S2 and the second processing block S4 via the transfer block S3 to the interface block S5. Therefore, a wafer W is carried from the carrier block S1 to the BCT1 layer or the BCT2 layer along the same carrying route. Therefore, wafers W are not carried from the processing blocks S2 and S4 in different carrying modes using different arms, such as a carrying mode not using the carrying arm G2 for carrying a wafer W from the second processing block S4 adjacent to the interface block S5, and a carrying mode using the arm G2 for carrying a wafer W from the first processing block S2, and hence wafers W are carried to the interface block S5 by the same number of carrying steps. Thus the carrying program is easy to create.

In this embodiment, the DEV1 layer, the BCT1 layer and the COT1 layer of the first processing block S2 and the DEV2 layer, the BCT2 layer and the COT2 layer of the second processing block S4 are disposed on the opposite sides, respectively, of the transfer block S3 so as to correspond to each other, and the main arms of the unit blocks that carries out the same film forming process, such as the main arms A12 and A22 of the BCT1 layer and the BCT2 layer, and the main arms A13 and A23 of the COT1 layer and the COT2 layer, can access the same transfer modules, such as the transfer modules TRS22 and TRS23, respectively.

Therefore, the transfer arm E of the transfer block S3 carries a wafer to be carried to the BCT1 layer or the BCT2 layer from the transfer module TRS-A to the transfer module TRS22, and carries a wafer W on which a resist film has been formed from the transfer module TRS23 to the transfer module TRS-A regardless of which one of the processing blocks S2 and S4 is used for processing the wafer W. Thus the carrying program is easy to create.

In this embodiment, the main arm A21 of the DEV2 layer receives a wafer W processed by the exposure process directly from the transfer module TRS31. The wafer W processed by the exposure process may be carried to the transfer module TRS-B of the transfer block S3 by the shuttle arm G3, and then the wafer W may be carried along a carrying route passing the transfer arm E, the transfer module TRS21, and the main arm A21 to the DEV2 layer.

Figure 8:
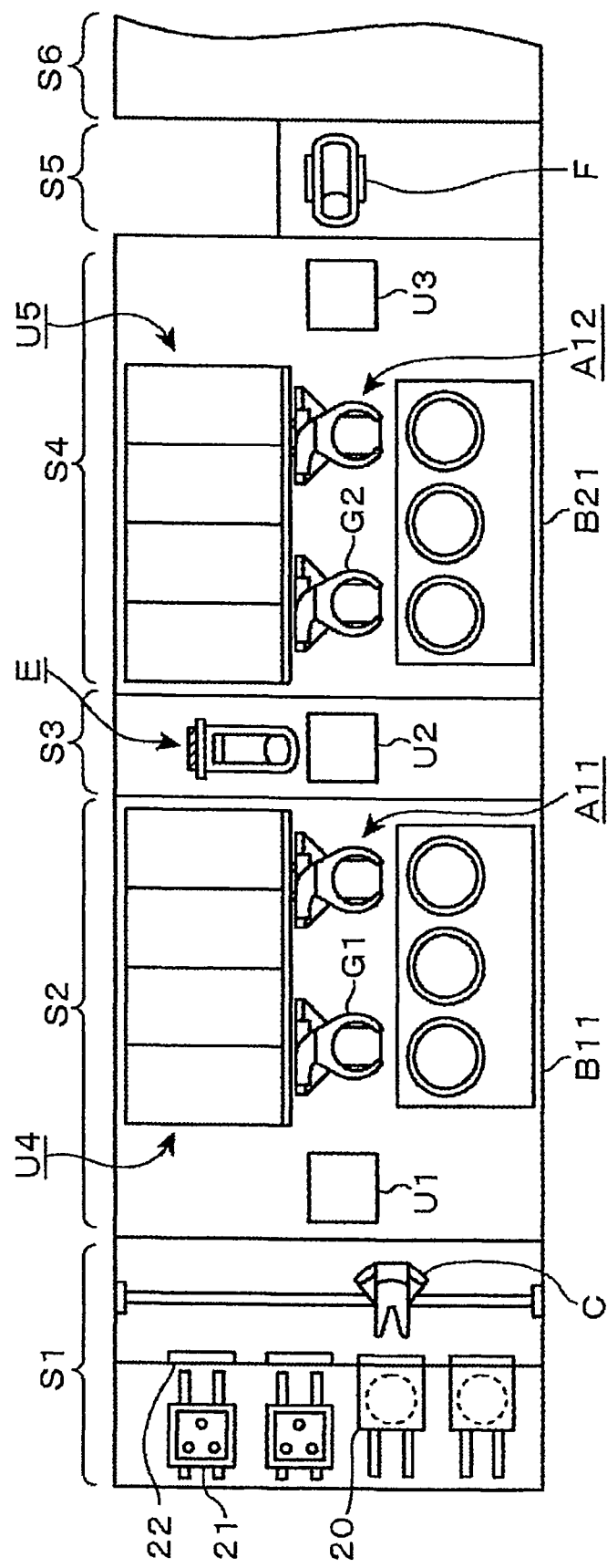
FIG. 8 is a plan view of a coating and developing system in a second embodiment according to the present invention.
Figure 9:
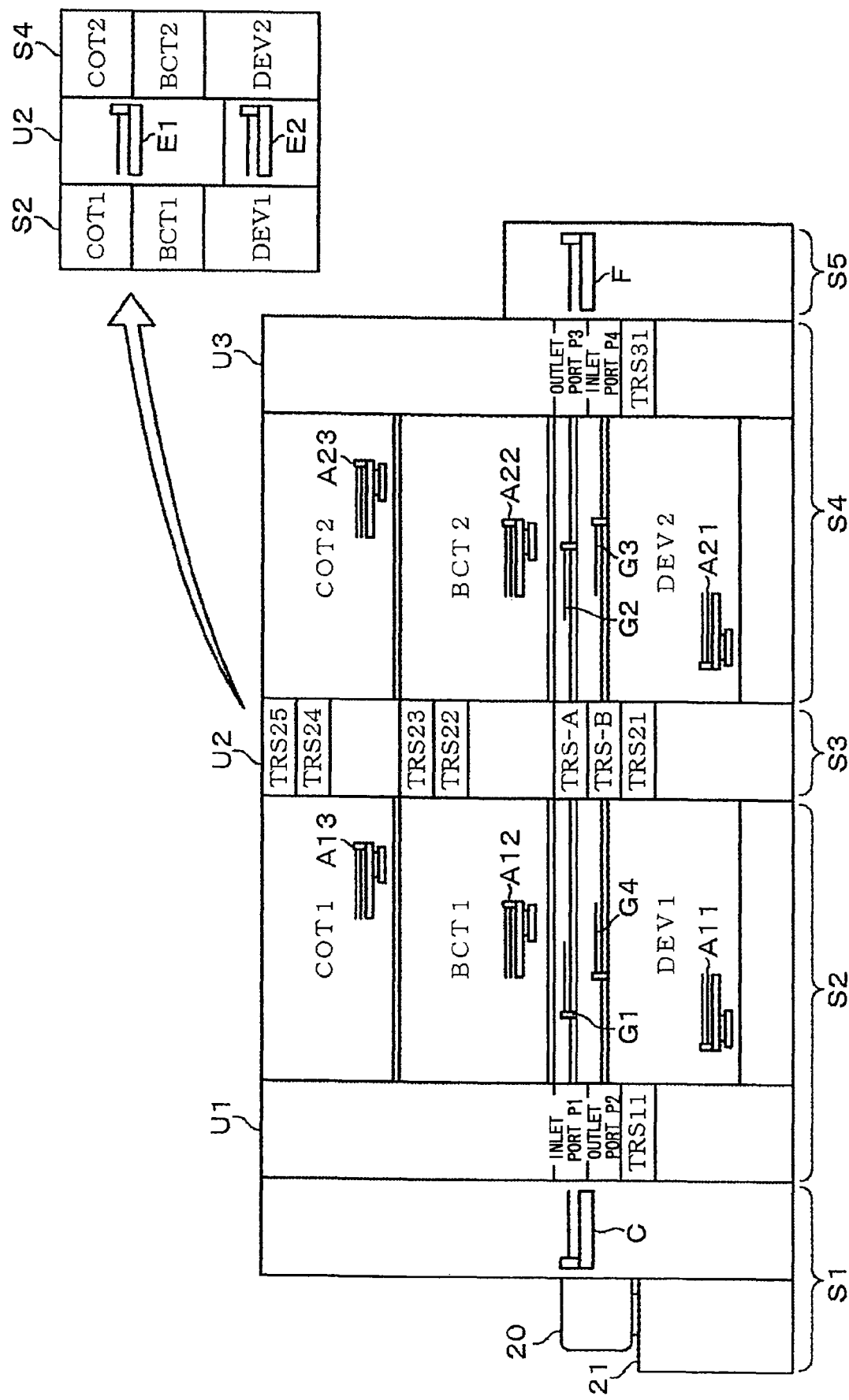
FIG. 9 is a side elevation of the coating and developing system shown in FIG. 8.
Figure 10:
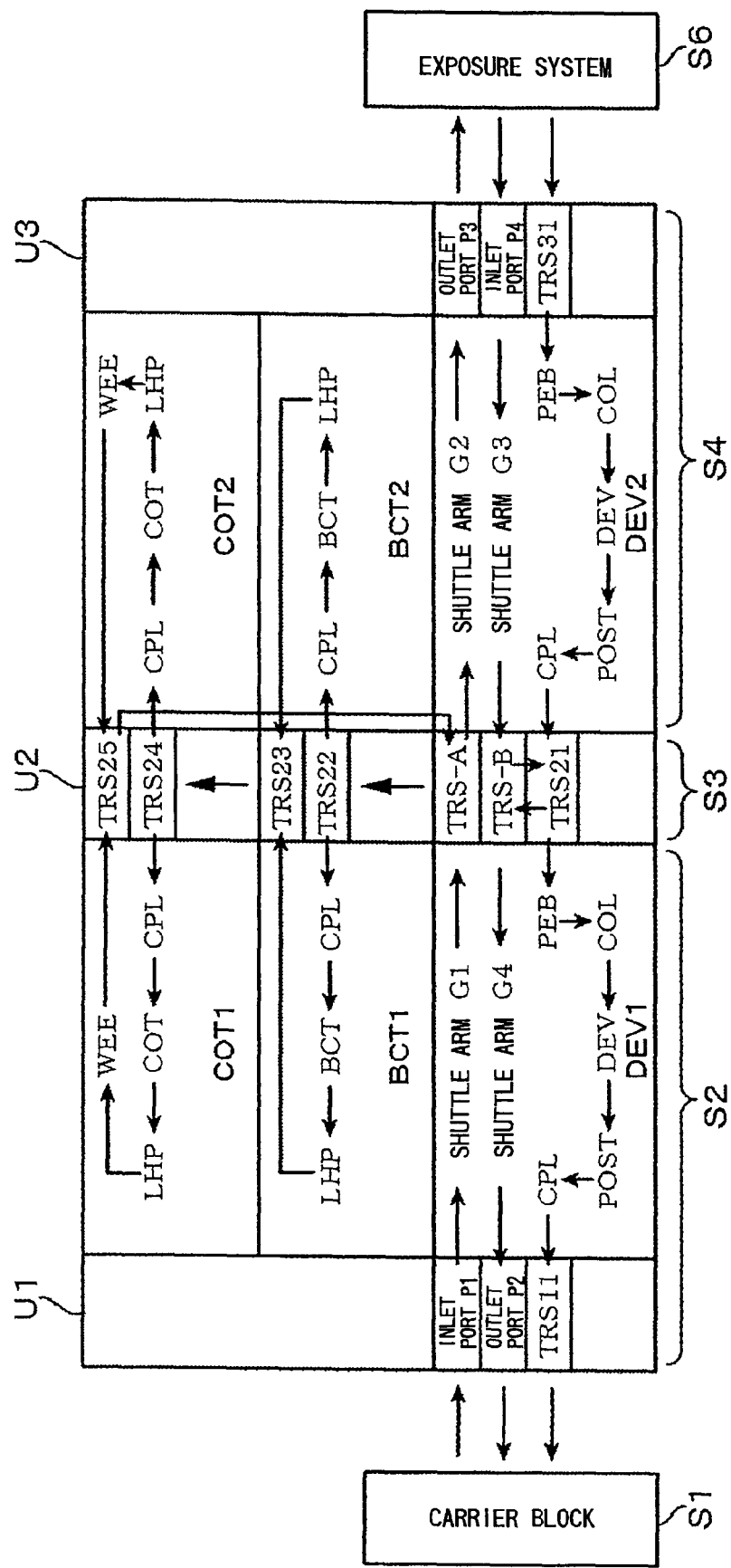
FIG. 10 is a side elevation of assistance in explaining carrying passages along which a wafer W is carried in the coating and developing system shown in FIG. 8.

A resist pattern forming system in a second embodiment according to the present invention will be described with reference to FIGS. 8 to 10. The resist pattern forming system in the second embodiment differs from that in the first embodiment in that a first processing block S2 and a second processing block S4 thereof are not provided with any arms corresponding to the first transfer arm D1 and the second transfer arm D2, and a transfer block S3 thereof is provided with two transfer arms, namely, an upper transfer arm E1 and a lower transfer arm E2, and differs in modules included in shelf units U1 to U3 thereof, and a wafer carrying route.

In this embodiment, the shelf unit U1 is provided with a first transfer unit including a transfer module TRS11, an inlet port P1 and an outlet port P2. A wafer W is transferred through the first transfer unit between the first processing block S2 and the second processing block S4. The shelf unit U3 is provided with a second transfer unit including a transfer module TRS31, an outlet port P3 and an inlet port P4, A wafer is transferred between a DEV2 layer included in the second processing block S4, and an interface block S5.

The shelf unit U2 of the transfer block S3 is provided with a transfer modules TRS21, TRS-A, TRS-B, TRS22, TRS23, TRS24 and TRS25. Main arms A11 and A21 included in the DEV1 layer and the DEV2 layer access the transfer module TRS21, shuttle arms G1 and G2 access the transfer module TRS-A, shuttle arms G3 and G4 access the transfer module TRS-B, main arms A12 and A22 included in a BCT1 layer and a BCT2 layer access the transfer module TRS22, main arms A13 and A23 included in a COT1 layer and a COT2 layer access the transfer modules TRS24 and TRS25.

The transfer arms E1 and E2 of the transfer block S3 are disposed in two vertically arranged zones, namely, an upper and a lower zone, respectively. For example, the transfer arm E2 transfers a wafer W to and from the transfer modules TRS21, TRS-A and TRS-B, and the transfer module E1 transfers a wafer W to and from the transfer modules TRS-A, TRS22, TRS23, TRS24 and TRS25.

A carrying route along which a wafer W is carried in the resist pattern forming system will be described with reference to FIG. 10 on a assumption that a resist film is formed on a first antireflection film. Wafers W are carried from the carrier block S1 via the transfer arm C, the inlet port P1 of the shelf unit U1, the shuttle arm G1, the transfer module TRS-A of the transfer block S3, and the transfer arm E1 to the transfer module TRS22. Then, the wafers W are carried from the transfer module TRS22 to the BCT1 layer and the BCT2 layer by the main arms A11 and A22, respectively.

In the BCT1 layer, the wafer W is carried by the main arm A12 successively to the predetermined modules in order as mentioned above, and then the wafer W is carried to the transfer module TRS23 of the transfer block S3. In the BCT2 layer, the wafer W is carried by the main arm A22 successively to the predetermined modules in order as mentioned above, and then the wafer W is carried to the transfer module TRS23 of the transfer block S3.

Then, the wafers W are carried from the transfer module TRS23 to the transfer module TRS24 by the transfer arm E1. Then, the wafers W are carried to the COT1 layer and the COT2 layer by the main arms A13 and A23, respectively. In the COT1 layer, the wafer W is carried by the main arm A13 successively to the predetermined modules in order as mentioned above, and then the wafer W is carried to the transfer module TRS25 of the transfer block S3. In the COT2 layer, the wafer W is carried by the main arm A23 successively to the predetermined modules in order as mentioned above, and then the wafer W is carried to the transfer module TRS25 of the transfer block S3.

After a first antireflection film and a resist film have been thus formed on each of the wafers W, the wafers W are collected in the transfer module TRS25. Then, the transfer arm E1 carries the wafers W to the transfer module TRS-A, and then the shuttle arm G2 carries the wafers W to the outlet port P3 of the shelf unit U3. Then, the interface arm F carries each wafer W to an exposure system S6. The exposure system S6 processes the wafer W by a predetermined exposure process.

When the wafer W processed by the exposure process is subjected to a developing process in the first processing block S2, the wafer W is carried along a route passing the interface arm F, the inlet port P4, the shuttle arm G3, the transfer module TRS-B of the transfer block S3, the transfer arm E2, the transfer module TRS21 and the main arm A11 to the DEV1 layer. In the DEV1 layer, the main arm A11 carries the wafer W successively to the predetermined modules in order as mentioned above to the transfer module TRS11 of the shelf unit U1. Then, the transfer arm C returns the wafer W processed by the developing process to a carrier 20, from which the wafer W was taken out, held in the carrier block S1

When the wafer W processed by the exposure process is subjected to a developing process in the second processing block S3, the transfer arm F carries the wafer W to the transfer module TRS31, and the main arm A21 carries the wafer W to the DEV2 layer. In the DEV2 layer, the main arm A21 carries the wafer W successively to the predetermined modules in order to the transfer module TRS21 of the transfer block S3. Then, the wafer W is carried along a route passing the transfer arm E2, the transfer module TRS-B and the shuttle arm G4 to the outlet port P2. Then, the transfer arm C returns the wafer W processed by the developing process to a carrier, from which the wafer W was taken out, held in the carrier block S1.

A controller 100 controls the main arms A11 to A13, and A21 to A23, the transfer arm C, the transfer arms E1 and E2, the shuttle arms G1 to G4 and the interface arm F on the basis of a carrying recipe stored therein to achieve the foregoing carrying operations.

This resist film forming system also processes a wafer W by the two processing blocks S2 and S4. Thus the resist film forming system can achieve an improved throughput. Since the processing blocks S2 and S4 are not provided with any arms corresponding to the transfer arms D1 and D2, and the transfer arms E1 and E2 are disposed in two vertically arranged zones, respectively, in the transfer block S3, the number of all the arms is small an hence the cost can be reduced. Since the transfer arms E1 and E2 are disposed in two vertically arranged zones, respectively, in the transfer block S3, carrying load can be shaped by the two transfer arms E1 and E2, and the transfer arms E1 and E2 operate in narrow areas. Therefore, nothing about the reduction of carrying efficiency needs to be considered.

In this embodiment, a wafer W is carried from the carrier block S1 via the transfer block 53 to the first processing block S1 or the second processing block s4, and a wafer W is carried from the first processing block S2 or the second processing block S4 via the transfer block, S3 to the interface block S5. Therefore, a carrying route passing the carrier block S1, the first processing block S2 and the interface block S5, and a carrying route passing the carrier block s1, the second processing block S4 and the interface block S5 are the same, and hence the carrying program is easy to create.

In this embodiment, when a wafer W processed by the exposure process is carried to the second processing block S4, the wafer W may be carried by the shuttle arm G3 to the transfer module TRS-B of the transfer block S3, and then the wafer W may be carried along a route passing the transfer module TRS21 and the main arm A21 to the DEV2 layer.

Figure 11:
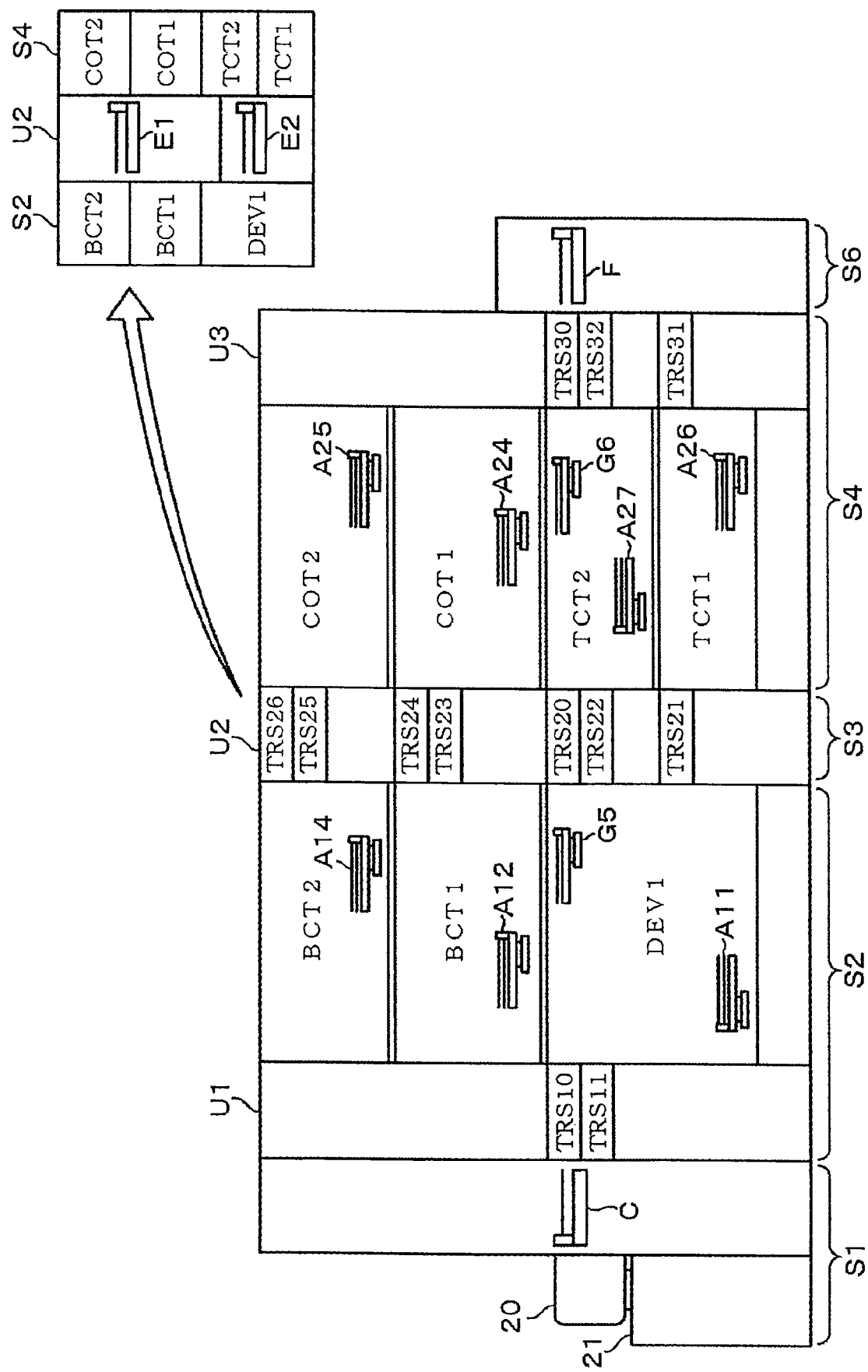
FIG. 11 is a side elevation of a coating and developing system in a third embodiment according to the present invention.
Figure 12:
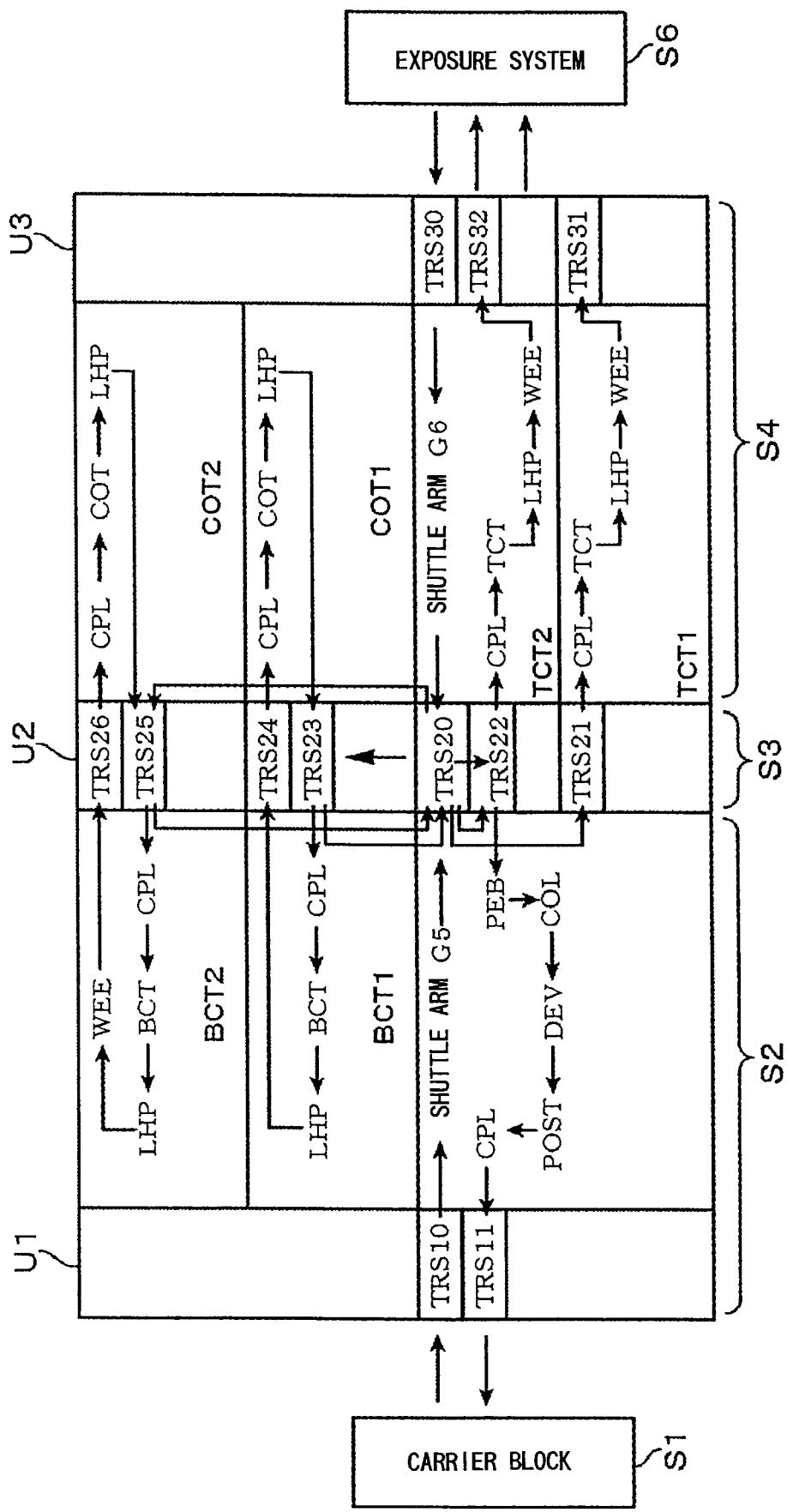
FIG. 12 is a side elevation of assistance in explaining carrying passages along which a wafer W is carried in the coating and developing system shown in FIG. 11.

A resist pattern forming system in a third embodiment according to the present invention will be described with reference to FIGS. 11 to 13. The resist pattern forming system in the third embodiment differs from that in the first embodiment in that a first processing block S2 and a second processing block S4 thereof are not provided with any arms corresponding to the first transfer arm D1 and the second transfer arm D2, and a transfer block S3 thereof is provided with two transfer arms, namely, an upper transfer arm E1 and a lower transfer arm E2, and differs in unit blocks included in the first processing block S2 and the second processing block S4, modules included in shelf units U1 to U3 thereof, and a wafer carrying route.

In the third embodiment, the first processing block S2 is built by stacking up a DEV1 layer and two BCT1 layer in that order, and the second processing block S4. The second processing block S4 is built by stacking up a TCT1 layer, a TCT2 layer, a COT1 layer and a COT2 layer in that order. The TCT1 layer and the TCT2 layer are second antireflection film forming layers for forming an antireflection film (hereinafter, referred to as "second antireflection film") on a resist film, and corresponds to a film forming unit block.

The DEV1 layer of the first processing block S2 and the TCT1 layer and the TCT2 layer of the second processing block S4, the BCT1 layer of the first processing block S2 and the COT1 layer of the second processing block S4, and the BCT2 layer of the first processing block S2 and the COT2 layer of the second processing block S4 are on the opposite sides, respectively, of the transfer block S3 so as to correspond to each other.

The BCT1 layer and the BCT2 layer are similar in construction. A main arm A14 carries a wafer W to and from the modules. The COT1 layer and the COT2 layer are similar in construction to the COT2 layer of the foregoing COT2 layer. Main arms A24 and A25 carry a wafer W to and from the modules.

The TCT1 layer and the TCT2 layer are substantially similar in construction to the COT2 layer of the foregoing embodiment. The TCT1 layer has, for example, three second antireflection film forming modules TCT, namely, wet-processing modules, for forming a second antireflection film on a wafer W. A shelf unit U5 is provided with a heating and cooling module LHP, a temperature adjusting module CPL and an edge exposure module WEE. A shelf unit U3 has a transfer module TRS31, namely, a second transfer unit, accessible by an interface arm F. A main arm A26 carries a wafer to and from those modules.

The TCT2 layer is provided with, for example, three second antireflection film forming modules TCT, namely, wet-processing modules. The shelf unit U5 is provided with a heating and cooling module LHP, a temperature adjusting module CPL and an edge exposure module WEE. The shelf unit U3 has a transfer module TRS30 and TRS32, namely, a second transfer unit, accessible by the interface arm F. A main arm A27 carries a wafer to and from those modules. The TCT2 layer is provided with a shuttle arm G6. The transfer stage TRS30 is used exclusively by the shuttle arm G5.

A shelf unit U1 is provided with transfer modules TRS10 and TRS11, namely, a first transfer unit, through which wafer W is transferred between the carrier block S1 and the DEV1 layer of the first processing block S2. The transfer modules TRS10 is used exclusively by the shuttle arm G5.

The shelf unit U2 of the transfer block S3 is provided with transfer modules TRS21 and TRS22 accessible by the main arm A11 of the DEV1 layer, the main arm A26 of the TCT1 layer and the main arm A27 of the TCT2 layer, a transfer module TRS20 accessible by the shuttle arms G1 and G2, transfer stages TRS23 and TRS24 accessible by the main arm A12 of the BCT1 layer, and the main arm A24 of the COT1 layer, and transfer modules TRS25 and TRS26 accessible by the main arm A14 of the BCT2 layer and the main arm A25 of the COT2 layer. The transfer module TRS20 is used exclusively by the shuttle arms G5 and G6.

The transfer arms E1 and E2 of the transfer block 53 are disposed in two vertically arrange zones, respectively. For example, the transfer arm E2 carries a wafer to and from the transfer modules TRS21, TRS22 and TRS20, and the transfer arm E1 carries a wafer W to and from the transfer modules TRS20, TRS23, TRS24, TRS25 and TRS26.

The shuttle arm G5 of the DEV1 layer will be described as an example of the shuttle arms G5 and G6 of this embodiment with reference to FIG. 13. The shuttle arm G5 has a support arm 71 on which peripheral areas of the back surface of a wafer W are seated. The support arm 71 can move forward and backward on a base plate 72. The base plate 72 is supported on a traveling base 74 so as to be turned about a vertical axis by a turning mechanism 73. The traveling base 74 is moved longitudinally along a guide rail 75 extended along the length of a carrying area R1 on a surface of a support member 76 extended in the direction of the length of the shelf unit, namely, a Y-direction in FIG. 13, and facing the carrying area R1. Thus a wafer W is carried between the transfer module TRS10 of the shelf unit U1 and the transfer module TRS20 of the transfer block S3.

The shuttle arm G6 is similar in construction to the shuttle arm G5. The shuttle arm G6 carries a wafer W between the transfer module TRS20 of the transfer block S3 and the transfer module TRS30 of the shelf unit U3. The transfer modules TRS10, TRS20 and TRS30 are similar in construction to the transfer module TRS13.

A carrying route along which a wafer W is carried in the resist pattern forming system will be described with reference to FIG. 12 on an assumption that a resist film is formed on a first antireflection film, and a second antireflection film is formed on the resist film. Wafers W are carried from the carrier block S1 along a carrying route passing the transfer arm C, the transfer module TRS10 of the shelf unit U1, the shuttle arm G5, the transfer module TRS20 of the transfer block S3, the transfer arm E1, and the transfer module TRS23 or the transfer module TRS25. The wafers W are carried from the transfer module TRS23 or the transfer module TRS25 to the BCT1 layer and the BCT2 layer by the main arms A12 and A14, respectively.

In the BCT1 layer, the main arm A12 carries the wafer W successively to the predetermined modules, and carries the processed wafer W to the transfer module TRS24 of the transfer block S3. In the BCT2 layer, the main arm A14 carries the wafer W successively to the predetermined modules, and carries the processed wafer W to the transfer module TRS26 of the transfer block S3.

The wafers W are carried to the COT1 layer and the COT2 layer by the main arms A24 and A25, respectively. In the COT1 layer, the wafer W is carried along a carrying route passing the temperature adjusting module CPL, the coating module COT, and the heating module LHP to the transfer module TRS23 of the transfer block S3 to form a resist film on a first antireflection film. In the COT2 layer, the wafer W is carried along a carrying route passing a temperature adjusting module CPL, the coating module COT, and the heating module LHP to the transfer module TRS25 of the transfer block S3 to form a resist film on a first antireflection film.

Subsequently, the wafers W are carried from the transfer modules TRS23 and TRS25 to the transfer module TRS20 by the transfer arm E1. Then, the transfer arm E2 carries the wafers W from the transfer module TRS20 to the transfer modules TRS21 and TRS22, respectively. Then, the main arms A26 and A27 carry the wafers W from the transfer modules TRS21 and TRS22 to the TCT1 layer and the TCT2 layer, respectively. In the TCT1 layer, the wafer W is carried along a carrying route passing the temperature adjusting module CPL, the second antireflection film forming module TCT, the heating module LHP, and the edge exposure module WEE to the transfer module TRS31 of the transfer block S3 to form a second antireflection film on the resist film. In the TCT2 layer, the wafer W is carried along a carrying route passing the temperature adjusting module CPL, the second antireflection film forming module TCT, the heating module LHP, and the edge exposure module WEE to the transfer module TRS32 of the transfer block S3 to form a second antireflection film on the resist film.

The interface arm F carries the wafers W from the transfer modules TRS31 and TRS32 to the exposure system 56 to subject the wafers W to a predetermined exposure process. The wafer w processed by the exposure process is carried along a carrying route passing the transfer arm F, the transfer module TRS30, the shuttle arm G6, the transfer module TRS20 of the transfer block S3, the transfer arm E2, the transfer module TRS21 or TRS22, and the main arm A11 to the DEV1 layer.

In the DEV1 layer, the main arm A11 carries the wafer W successively to the predetermined modules, and carries the wafer W processed by those modules to the transfer module TRS11 of the shelf unit U1. Then, the transfer arm C returns the wafer W from the transfer module TRS11 to the carrier 20, from which the wafer W was taken out, held in the carrier block S1.

A controller 100 controls the main arms A11 to A14, and A24 to A27, the transfer arm C, the transfer arms E1 and E2, the shuttle arms G5 and G6, and the interface arm F on the basis of a carrying recipe stored therein to achieve the foregoing carrying operation.

Thus the first processing block S2 may be provided with the DEV1 layer, and the second processing block 54 may be provided with the TCT1 layer and the TCT2 layer. Use of the two processing blocks 52 and 54 can improve the throughput.

Since the BCT1 layer and the COT1 layer, and the BCT2 layer and the COT2 layer are on the opposite sides, respectively, of the transfer block S3 so as to correspond to each other, a wafer W can be transferred from the BCT1 layer to the COT1 layer (BCT2 layer to the COT2 layer) through the common transfer stage TRS24 (TRS26). Thus a wafer can be carried from the BCT1 layer to the COT1 layer (from the BCT2 layer to the COT2 layer) along a route passing the main arm A12, the transfer module TRS24 and the main arm A24 (main arm A14, the transfer module TRS26 and the main arm A25) and the transfer arm E1 is not necessary for carrying a wafer W along the route. Consequently, the load on the transfer arm E1 is reduced and carrying efficiency can be improved.

A method of transferring a wafer W from the carrier block S1 to the BCT1 layer, and a method of transferring a wafer W from the carrier block S1 to the BCT2 layer are the same, and a method of transferring a wafer W from the BCT1 layer to the COT1 layer, and a method of transferring a wafer W from the BCT2 layer to the COT2 layer are the same, the carrying program is easy to create.

Figure 14:
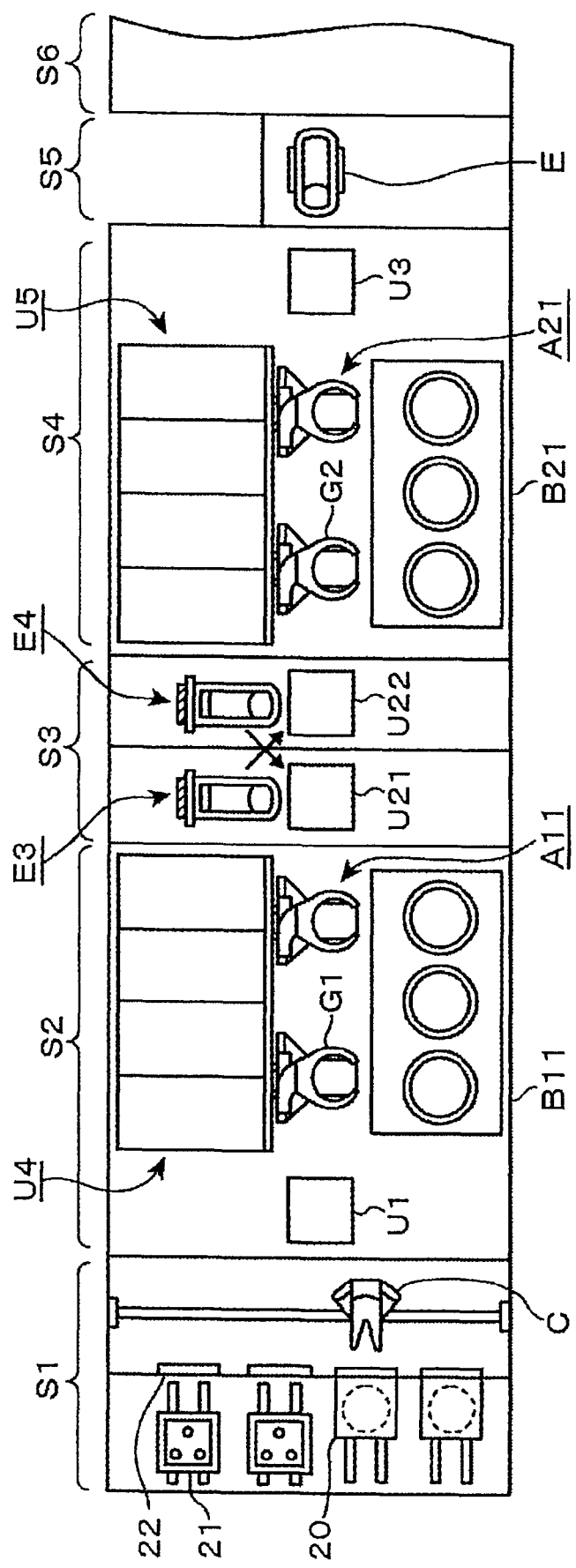
FIG. 14 is a plan view of a coating and developing system in a fourth embodiment according to the present invention.
Figure 15:
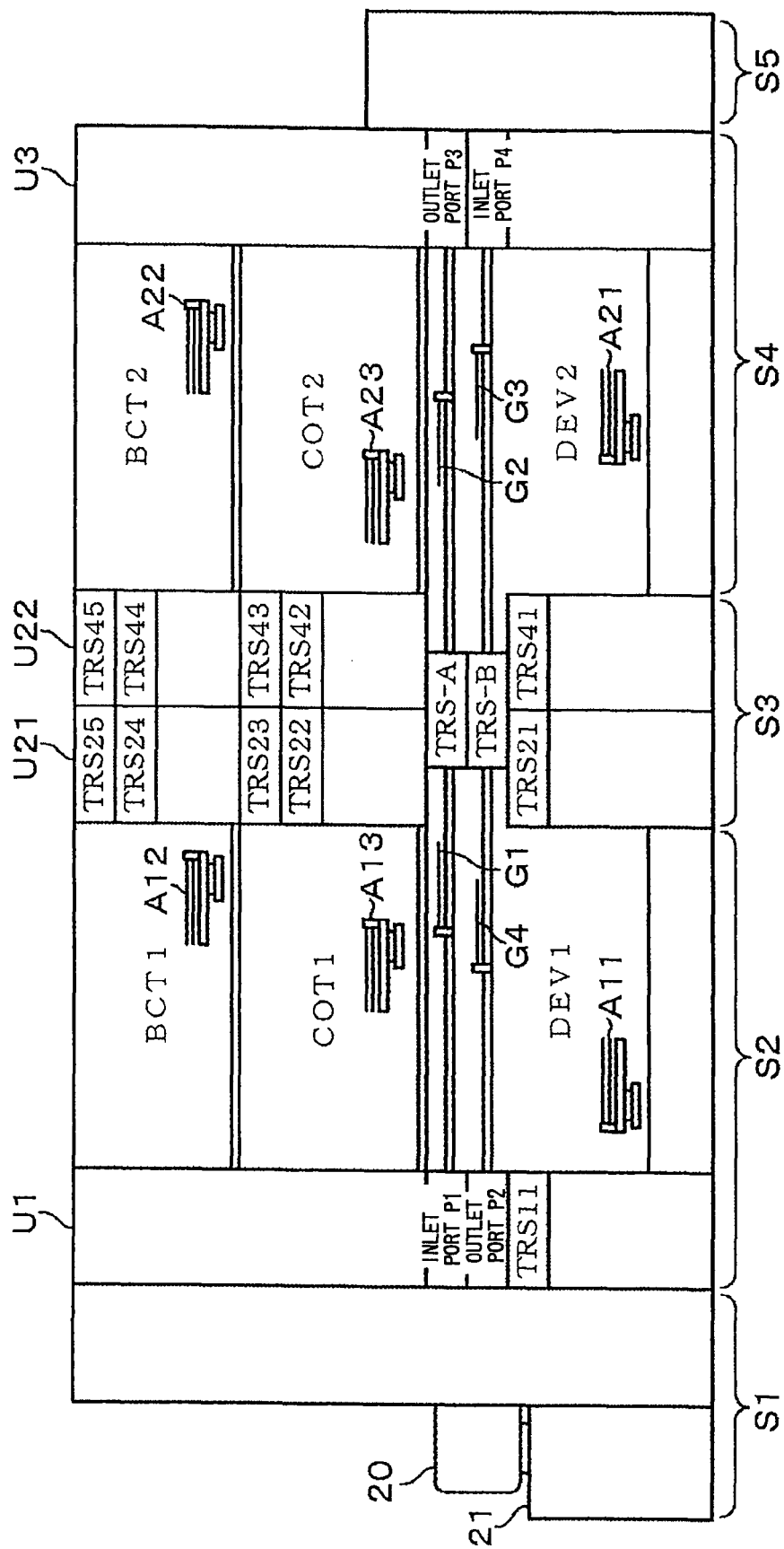
FIG. 15 is a side view of a coating and developing system in a fifth embodiment according to the present invention.
Figure 16:
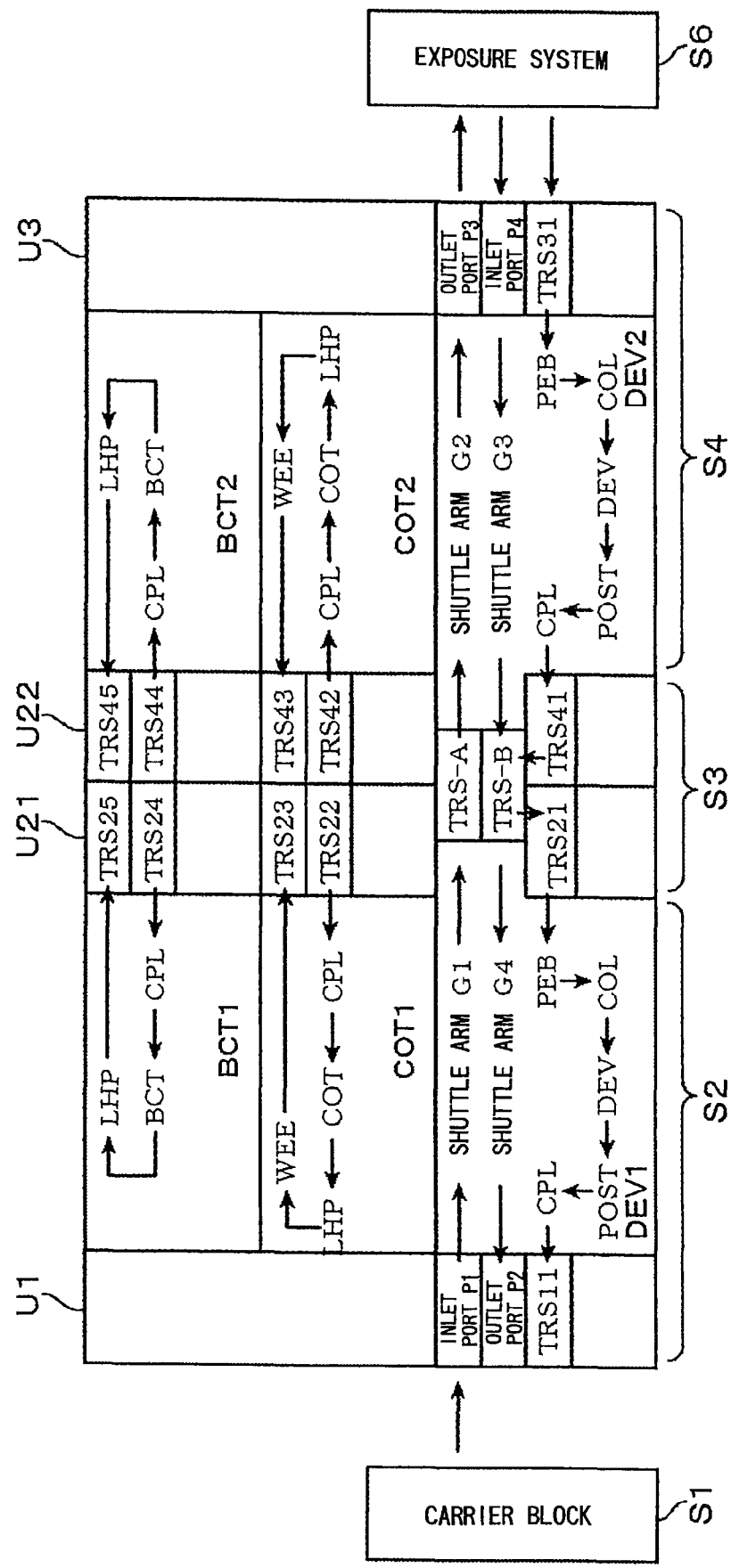
FIG. 16 is a side elevation of assistance in explaining carrying passages along which a wafer W is carried in the coating and developing system shown in FIG. 15.
Figure 17:
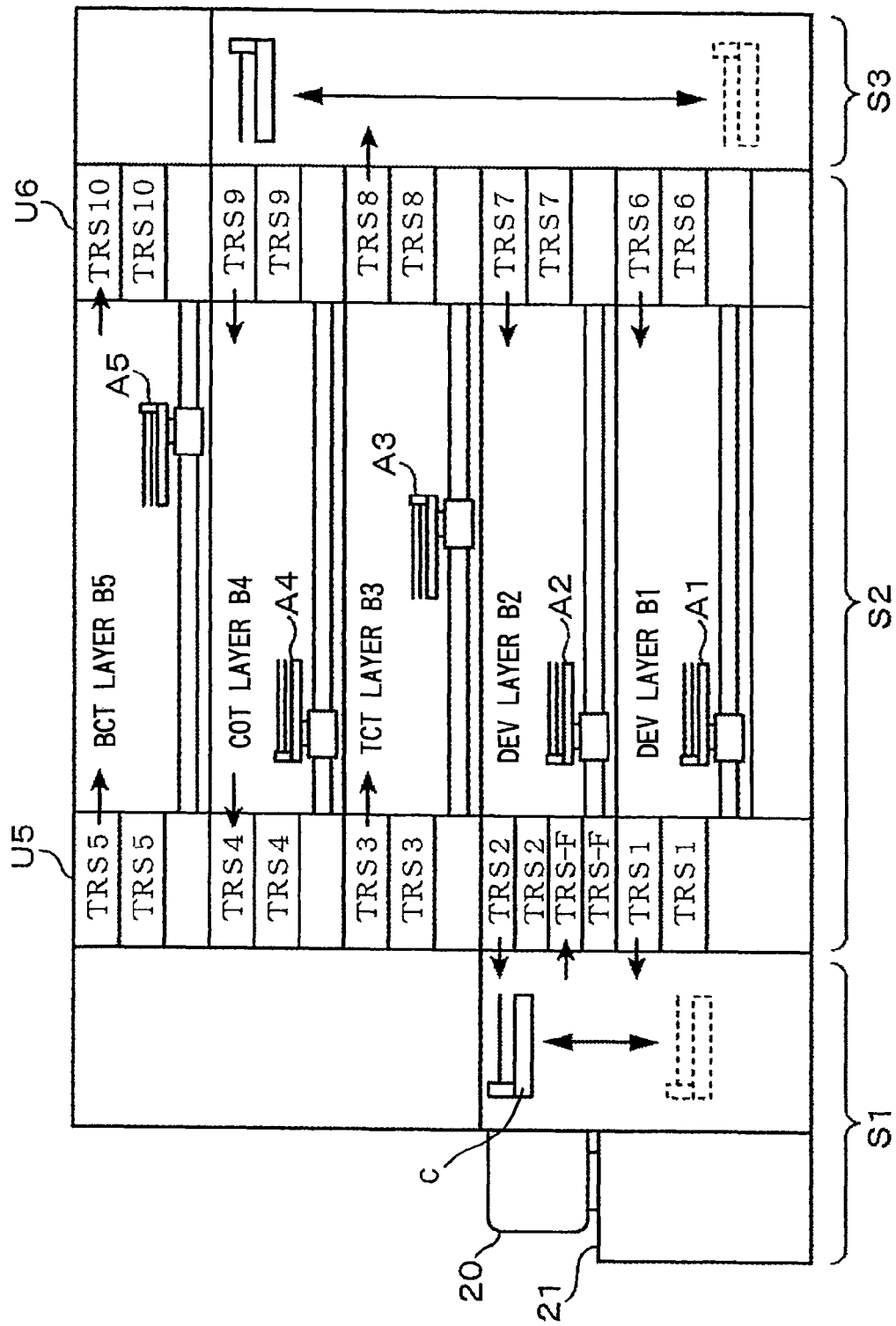
FIG. 17 is a side elevation of a conventional coating and developing system.

A resist pattern forming system in a fourth embodiment according to the present invention will be described with reference to FIGS. 14 to 16. The resist pattern forming system in the fourth embodiment differs from that in the first embodiment in the arrangement of unit blocks in a first processing block S2 and a second processing block S4, not providing the first processing block S2 and the second processing block S4 with any means corresponding to the first transfer arm D1 and the second transfer arm D2, the construction of a transfer block S3, modules included in shelf units U1 and U3, and a wafer carrying route.

The first processing block S2 is built by stacking up a DEV1 layer, a COT1 layer and a BCT1 layer in that order. The second processing block S4 is built by stacking up a DEV2 layer, COT2 layer and a BCT2 layer in that order. The DEV1 layer and the DEV2 layer, the COT1 layer and the COT2 layer, and the BCT1 layer and the BCT2 layer are on the opposite sides, respectively, of a transfer block S3 so as to correspond to each other. The DEV1 layer, the DEV2 layer, the COT1 layer, the COT2 layer, the BCT1 layer and the BCT2 are similar in construction to those of the first embodiment, respectively.

The transfer block S3 is provided with two adjacently disposed shelf units U21 and U22. Each of the shelf units U21 and U22 is provided with transfer parts arranged in multiple layers. A transfer arm E3 carries a wafer W to and from each of the transfer parts of the shelf unit U21, and a transfer arm E4 carries a wafer W to and from each of the transfer parts of the shelf unit U22.

A wafer W is carried to and from the first processing block S2 through the shelf unit U21. Therefore, the transfer parts of the shelf unit U21 are accessible by main arms A11 to A13 of the first processing block S2. A wafer W is carried to and from the second processing block S4 through the shelf unit U22. Therefore, the transfer parts of the shelf unit U22 are accessible by main arms A21 to A23 of the second processing block S4.

The shelf units U21 and U22 are provided with a common transfer module TRS-A to be used exclusively by shuttle arms G1 and G2, and a common transfer module TRS-B to be used exclusively by shuttle arms G3 and G4. The common transfer module TRS-A is accessible by the shuttle arms G1 and G2, and the common transfer module TRS-B is accessible by the shuttle arms G3 and G4. The transfer arms E3 and E4 can move forward and backward, can move vertically and can turn about a vertical axis. The transfer arms E3 and E4 can access the common transfer modules TRS-A and TRS-B.

The shelf unit U21 of the transfer block S3 has a transfer module TRS21 accessible by the main arm A11 of the DEV1 layer, transfer modules TRS22 and TRS23 accessible by the main arm A13 of the COT1 layer B13, and transfer modules TRS24 and TRS25 accessible by the main arm A12 of the BCT1 layer. The shelf unit U22 of the transfer block S3 has a transfer module TRS41 accessible by the main arm A21 of the DEV2 layer, transfer modules TRS42 and TRS43 accessible by the main arm A23 of the COT2 layer, and transfer modules TRS44 and TRS45 accessible by the main arm A22 of the BCT2 layer.

The shelf unit U1 of the first processing block S2 has a transfer module TRS11, namely, a first transfer unit, through which a wafer W is transferred between the carrier block S1 and the DEV1 layer, an inlet port P1 and an outlet port P2. The shelf unit U3 of the second processing block S4 has an outlet port P3 and an inlet port P4, namely, a second transfer unit, through which a wafer W is transferred between the DEV2 layer and an interface block S5.

A carrying route along which a wafer W is carried in the resist pattern forming system will be described with reference to FIG. 16 on an assumption that a resist film is formed on a first antireflection film by way of example. The transfer arm C of the carrier block S1 transfers wafers W through the inlet port P1 of the shelf unit U1 to the shuttle arm G1. The shuttle arm G1 carries the wafers W to the transfer module TRS-A of the transfer block S3, and then the transfer block S3 distributes the wafers W to the first processing block S2 and the second processing block S4.

To carry a wafer W to the first processing block S2, the wafer W is carried along a route passing the transfer module TRS-A and the transfer arm E3 to the transfer module TRS24. Then, the main arm A12 carries the wafer W to the BCT1 layer. The main arm A12 carries the wafer W successively to predetermined modules of the BCT1 layer in order, and then carries the processed wafer W to the transfer module TRS25 of the shelf unit U21.

Subsequently, the wafer W is carried from the transfer module TRS25 via the transfer arm E3 to the transfer module TRS22. Then, the main arm A13 of the COT1 layer carries the wafer W successively to predetermined modules of the COT1 layer in order, and then carries the processed wafer W to the transfer module TRS23 of the shelf unit U21. Then, the transfer arm E3 carries the wafer W from the transfer module TRS23 to the transfer module TRS-A. Then, the wafer W is transferred from the shuttle arm G2 through the outlet port P3 to the interface arm F. The wafer W is carried to an exposure system S6 and is processed by a predetermined exposure process.

To carry a wafer W to the second processing block S4, the wafer W is carried along a route passing the transfer module TRS-A and the transfer arm E4 to the transfer module TRS44. Then, the main arm A22 carries the wafer W to the BCT2 layer. The main arm A22 carries the wafer W successively to predetermined modules of the BCT2 layer in order, and then carries the processed wafer W to the transfer module TRS45 of the shelf unit U22.

Subsequently, the wafer W is carried from the transfer module TRS45 via the transfer arm E4 to the transfer module TRS42. Then, the main arm A23 of the COT2 layer carries the wafer W successively to predetermined modules of the COT2 layer in order, and then carries the processed wafer W to the transfer module TRS43 of the shelf unit U22. Then, the transfer arm E4 carries the wafer W from the transfer module TRS43 to the transfer module TRS-A. Then, the wafer W is transferred from the shuttle arm G2 through the outlet port P3 to the interface arm F.

The wafer W processed by the exposure process is carried to the DEV1 layer of the first processing block S2 along a route passing the interface arm F, the inlet port P4, the shuttle arm G3, the transfer module TRS-B, the transfer arm E3, the transfer module TRS21 and the main arm A11. The wafer W is carried successively to predetermined modules of the DEV1 layer in order. Then, the wafer W is transferred through the transfer module TRS11 of the shelf unit U1 to the transfer arm C. The transfer arm C returns the wafer W to the carrier 20, from which the wafer W was taken out, held in the carrier block S1.

The wafer W processed by the exposure process is carried to the DEV2 layer of the second processing block S4 along a route passing the interface arm F, the transfer module TRS31 and the main arm A21. The wafer W is carried successively to predetermined modules of the DEV2 layer in order. Then, the wafer W is carried along a carrying route passing the transfer module TRS41 of the shelf unit U22, the transfer arm E4, the transfer module TRS-B, the shuttle arm G4 to the outlet port P2 of the shelf unit U1. The wafer W is transferred through the outlet port P2 to the transfer arm C. The transfer arm C returns the wafer W to the carrier 20, from which the wafer W was taken out, held in the carrier block S1.

A controller 100 controls the main arms A11 to A13, and A21 to A23, the transfer arm C, the transfer arms E3 and E4, the shuttle arms G1 to G4, and the interface arm F on the basis of a recipe stored therein to achieve the foregoing carrying operation.

The transfer block S3 is provided with the shelf unit U21 provided with transfer parts through which a wafer W is transferred between the transfer block S3 and the first processing block S2, the shelf unit U22 provided with transfer parts through which a wafer W is transferred between the transfer block S3 and the second processing block S4, and the transfer arms E3 and E4 that can access the transfer parts of the shelf units U21 and U22. Therefore, loads on the transfer arms E3 and E4 are small and hence throughput can be improved.

In this embodiment, a wafer W is carried from the carrier block S1 via the transfer block S3 to the first processing block S2 or the second processing block S4, and a wafer W is carried from the first processing block S2 or the second processing block S4 via the transfer block S3 to the interface block S5. Therefore, the carrying route from the carrier block S1 via the first processing block S2 to the interface block S5, and the carrying route from the carrier block S1 via the second processing block S4 to the interface block S5 are the same, and hence the carrying program is easy to create.

In this embodiment, a wafer W processed by the exposure process may be carried to the second processing block S4 by carrying the wafer W to the transfer module TRS-B of the transfer block S3 by the shuttle arm G3, and carrying the wafer W from the transfer module TRS-B via the transfer module TRS41 to the DEV2 layer by the main arm A21.

Although the first processing block S2 and the second processing block S4 according to the present invention are individually provided with the shuttle arms, common shuttle arms may be used. Although the foregoing embodiments are provided with the shuttle arms exclusively for forward carrying and exclusively for backward carrying, the resist pattern forming system of the present invention may be provided with common shuttle arms capable of operating both forward and backward carrying. The shuttle arms may be disposed in the respective top unit blocks of the first processing block S2 and the second processing block S4. The shuttle arms for forward carrying and those for backward carrying may be disposed in different unit blocks, respectively. Either of the shuttle arms of the construction shown in FIG. 6 and those of the construction shown in FIG. 13 may be employed.

The present invention is applicable to forming only a resist film, namely, a coating film, to forming a resist film and a second antireflection film, and to forming a first antireflection film, a resist film and a second antireflection film. The unit blocks of the first processing block S2 and the second processing block may be those optionally selected from BCT layers, COT layers and TCT layers, and those unit blocks may be stacked in optional arrangement, provided that both the first processing block S2 and the second processing block S4 include film forming unit blocks, and either of the first processing block S2 and the second processing block S4 includes a developing unit block.

The processing modules of the shelf units U4 and U5 may be those other than those mentioned above. The transfer parts of the shelf units U1, U2 and U3 may increase the number of transfer modules and may be modules capable of serving as both a temperature adjusting mechanism and a transfer part.

The shelf units U1 to U3 may include a hydrophobicity imparting module and may include an inspection unit for measuring the thickness of a film and inspecting a wafer W for warp.

The present invention is applicable not only to a coating and developing system for processing a semiconductor wafer, but also to a coating and developing system for processing a substrate, such as a glass substrate for a liquid crystal display, namely, an LCD substrate.

What is claimed is:

1. A coating and developing system, for forming films including a resist film on a substrate carried in a carrier delivered to a carrier block by film forming unit blocks, carrying the substrate through an interface block to an exposure system, processing the substrate processed by an exposure process and returned through the interface block from the exposure system by a developing process, transferring the substrate processed by the developing process to the carrier block, each of film forming unit blocks and developing unit blocks including a wet-processing module for applying a chemical solution to a substrate, a heating module for heating a substrate, a cooling module for cooling a substrate, substrate carrying means for carrying a substrate to and from those modules; said coating and developing system comprising:

a first processing block connected to the carrier block, formed by stacking up a plurality of unit blocks including a film forming block in layers, and capable of receiving a substrate carried by a transfer means installed in the carrier block from the carrier block and of transferring a substrate to the carrier block by the transfer means;

a second processing block connected to the interface block, formed by stacking up a plurality of unit blocks including a film forming unit block in layers, and capable of receiving a substrate carried by an interface arm installed in the interface block from the interface block and of transferring a substrate to the interface block by the interface arm;

a transfer block interposed between the first and the second processing block, and including a plurality of common transfer units stacked up in layers to receive a substrate from and to transfer a substrate to substrate carrying means included in the unit blocks of the first and the second processing block, and provided with a transfer arm for carrying a substrate to and from the common transfer units;

a developing module installed at least in either of the first and the second processing block and put on the film forming unit block;

a first direct carrying means installed in the first processing block to transfer a substrate between the carrier block and the common transfer unit blocks of the transfer block;

a second direct carrying means installed in the second processing block to transfer a substrate between the common transfer unit blocks of the transfer block and the interface block; and a control means for controlling the transfer means, the direct carrying means, the transfer arms, the substrate carrying means and the interface arm so that the first direct carrying means carries a substrate from the carrier block to the transfer block, substrates are transferred from the transfer block selectively to the film forming unit block of the first processing block and to the film forming unit block of the second processing block, substrates on which films including a resist film have been formed by the first and the second processing block are transferred from the first and the second processing block to the transfer block, and the substrate is carried from the transfer block to the interface block by the direct carrying means.

2. The coating and developing system according to claim 1, wherein the substrate on which films including a resist film have been formed is carried from the second processing block to the interface block by the substrate carrying means instead of carrying the substrate on which films including a resist film have been formed from the transfer block to the interface block by the second direct carrying means.

3. The coating and developing system according to claim 2, wherein the first processing block is provided with first transfer units stacked in layers in an area adjacent to the carrier block to transfer a substrate to and from the stacked unit blocks of the first processing block and to transfer a substrate between the first processing block and the carrier block, and a first transfer arm for carrying a substrate to and from the first transfer units.

4. The coating and developing system according to claim 3, wherein the second processing block is provided with second transfer units stacked up in layers in an area adjacent to the interface block to transfer a substrate to and from the stacked unit blocks of the second processing block and to transfer a substrate between the second processing block and the interface block, and a second transfer arm for carrying a substrate to and from the second transfer modules.

5. The coating and developing system according to claim 2, wherein the second processing block is provided with second transfer units stacked up in layers in an area adjacent to the interface block to transfer a substrate to and from the stacked unit blocks of the second processing block and to transfer a substrate between the second processing block and the interface block, and a second transfer arm for carrying a substrate to and from the second transfer modules.

6. The coating and developing system according to claim 2, wherein each of the first and the second direct carrying means includes a forward direct carrying means for carrying a substrate from the carrier block toward the interface block, and a backward direct carrying means for carrying a wafer from the interface block toward the carrier block.

7. The coating and developing system according to claim 2, wherein the unit blocks for forming a film of the same type are disposed in the first and the second processing block on the opposite sides, respectively, of the transfer block so as to correspond to each other, and the substrate carrying mean of the unit blocks that form a film of the same type carry a substrate to and from the common transfer units of the transfer block.

8. The coating and developing system according to claim 1, wherein the first processing block is provided with first transfer units stacked in layers in an area adjacent to the carrier block to transfer a substrate to and from the stacked unit blocks of the first processing block and to transfer a substrate between the first processing block and the carrier block, and a first transfer arm for carrying a substrate to and from the first transfer units.

9. The coating and developing system according to claim 8, wherein the second processing block is provided with second transfer units stacked up in layers in an area adjacent to the interface block to transfer a substrate to and from the stacked unit blocks of the second processing block and to transfer a substrate between the second processing block and the interface block, and a second transfer arm for carrying a substrate to and from the second transfer modules.

10. The coating and developing system according to claim 1, wherein the second processing block is provided with second transfer units stacked up in layers in an area adjacent to the interface block to transfer a substrate to and from the stacked unit blocks of the second processing block and to transfer a substrate between the second processing block and the interface block, and a second transfer arm for carrying a substrate to and from the second transfer modules.

11. The coating and developing system according to claim 1, wherein each of the first and the second direct carrying means includes a forward direct carrying means for carrying a substrate from the carrier block toward the interface block, and a backward direct carrying means for carrying a wafer from the interface block toward the carrier block.

12. The coating and developing system according to claim 11, wherein the transfer block is provided with stacked transfer units for the first processing block to transfer a substrate to and to receive a substrate from the film forming unit blocks of the first processing block, a transfer arm for the first processing block to carry a substrate to and from the transfer units of the first processing block, stacked transfer units for the second processing block to transfer a substrate to and to receive a substrate from the film forming unit blocks of the second processing block, and a transfer arm for the second processing block to carry a substrate to and from the transfer units of the second processing block.

13. The coating and developing system according to claim 1, wherein the unit blocks for forming a film of the same type are disposed in the first and the second processing block on the opposite sides, respectively, of the transfer block so as to correspond to each other, and the substrate carrying mean of the unit blocks that form a film of the same type carry a substrate to and from the common transfer units of the transfer block.

14. The coating and developing system according to claim 13, wherein the transfer block is provided with stacked transfer units for the first processing block to transfer a substrate to and to receive a substrate from the film forming unit blocks of the first processing block, a transfer arm for the first processing block to carry a substrate to and from the transfer units of the first processing block, stacked transfer units for the second processing block to transfer a substrate to and to receive a substrate from the film forming unit blocks of the second processing block, and a transfer arm for the second processing block to carry a substrate to and from the transfer modules of the second processing block.

15. The coating and developing system according to claim 1, wherein the film forming unit blocks include resist film forming unit blocks for forming a resist film on a substrate, and antireflection film forming unit blocks for forming an antireflection film on a substrate before or after a resist film has been formed on the substrate.

16. The coating and developing system according to claim 15, wherein resist film forming unit blocks for forming a resist film on a substrate, and antireflection film forming unit blocks for forming an antireflection film on a substrate before or after a resist film is formed on the substrate are disposed in the first and the second processing block on the opposite sides, respectively, of the transfer block, and substrate carrying means included in the unit blocks carry a wafer to and from common transfer units included in the transfer block.

17. The coating and developing system according to claim 1, wherein the transfer block is provided with stacked transfer units for the first processing block to transfer a substrate to and to receive a substrate from the film forming unit blocks of the first processing block, a transfer arm for the first processing block to carry a substrate to and from the transfer units of the first processing block, stacked transfer units for the second processing block to transfer a substrate to and to receive a substrate from the film forming unit blocks of the second processing block, and a transfer arm for the second processing block to carry a substrate to and from the transfer units of the second processing block.

18. A coating and developing method for forming films including a resist film on a substrate carried in a carrier delivered to a carrier block by film-forming unit blocks, carrying the substrate through an interface block to an exposure system after forming films including a resist film on the substrate, processing the substrate returned through the interface block from the exposure system by a developing process by a developing unit block, and transferring the substrate processed by the developing process to the carrier block, said coating and developing method comprising the steps of:

- transferring a substrate by a transfer means included in the carrier block from the carrier block to a first direct carrying means included in a first processing block built by stacking up a plurality of unit blocks including a film forming unit block and connected to the carrier block;
- carrying the substrate by the first direct carrying means to a transfer block connected to the first processing block and to a second processing block built by stacking up a plurality of unit blocks including a film forming unit block;
- carrying the substrate to one of common transfer units, through which substrates are transferred to the film forming unit blocks of the first and the second processing block, stacked in layers in the transfer block by a transfer arm installed in the transfer block;
- transferring the substrates from the common transfer unit to the film forming unit block of the first processing block by a substrate carrying means installed in the film forming unit of the first processing block or to the film forming unit block of the second processing block by a substrate carrying means installed in the film forming unit of the second processing block;
- processing the substrate by a predetermined film forming process by the film forming module received the substrate;
- carrying the substrate on which a film has been formed by the substrate carrying means to the common transfer unit of the transfer block; and
- carrying the substrate from the common transfer module of the transfer block to the interface block by a second direct carrying means installed in the second processing block.

19. The coating and developing method according to claim 18 further comprising the step of carrying the substrate from the common transfer module of the transfer block to the interface block by the substrate carrying means installed in the second processing block instead of carrying the substrate by the second direct carrying means of the second processing block from the common transfer module of the transfer block to the interface.

20. A non-transitory storage medium storing a computer program to be carried out by a coating and developing system that forms films including a resist film on a substrate received from a carrier block and processes the substrate processed by an exposure process by a developing process;

- wherein the program includes a set of instructions specifying the steps of the coating and developing method set forth in claim 18.

* * * * *